(12) United States Patent
Imamura et al.

(10) Patent No.: US 12,713,660 B2
(45) Date of Patent: Aug. 18, 2026

(54) THIN FILM TRANSISTOR AND METHOD OF MANUFACTRUTING THIN FILM TRANSISTOR

(71) Applicant: TOPPAN Inc., Taito-ku (JP)

(72) Inventors: Chihiro Imamura, Taito-ku (JP); Manabu Ito, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 373 days.

(21) Appl. No.: 18/466,013

(22) Filed: Sep. 13, 2023

(65) Prior Publication Data

US 2023/0420573 A1 Dec. 28, 2023

Related U.S. Application Data

(63) Continuation of application No. PCT/JP2022/011584, filed on Mar. 15, 2022.

(30) Foreign Application Priority Data

Mar. 15, 2021 (JP) ................................ 2021-041758
Aug. 19, 2021 (JP) ................................ 2021-134322

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01); *H10D 30/6729* (2025.01); *H10D 30/673* (2025.01)

(58) Field of Classification Search
CPC ............. H10D 30/6755; H10D 30/031; H10D 30/6729; H10D 30/673; H10D 30/6739;
(Continued)

(56) References Cited

U.S. PATENT DOCUMENTS

2015/0129864 A1* 5/2015 Hsu .................... H10D 30/6739 257/43
2015/0228674 A1* 8/2015 Miki .................. H10D 30/6739 257/43
(Continued)

FOREIGN PATENT DOCUMENTS

JP 2010-021264 A 1/2010
JP 7115610 B1 8/2022
KR 100857455 B1 * 9/2008 ......... H10D 30/6757

OTHER PUBLICATIONS

International Search Report issued Jun. 14, 2022 in PCT/JP2022/011584 filed Mar. 15, 2022, 5 pages.
(Continued)

*Primary Examiner* — Shahan Ur Rahaman
(74) *Attorney, Agent, or Firm* — Oblon, McClelland, Maier & Neustadt, L.L.P.

(57) ABSTRACT

A gate insulating layer of a thin film transistor includes a first gate insulating coating including an organic polymer compound or an organic-inorganic composite material, and a second gate insulating coating including one selected from a group of silicon oxide, silicon nitride, silicon oxynitride, and aluminum oxide. The second gate insulating coating is sandwiched between the first gate insulating coating and a semiconductor layer. The first gate insulating coating has a thickness of 100 nm or greater and 1500 nm or less, and a product of the thickness and Young's modulus of the first gate insulating coating is 300 nm·GPa or greater and 30000 nm·GPa or less. The second gate insulating coating has a thickness of 2 nm or greater and 30 nm or less, and a product of the thickness and Young's modulus of the second gate insulating coating is 100 nm·GPa or greater and 9000 nm·GPa or less.

14 Claims, 7 Drawing Sheets

(58) Field of Classification Search
CPC ............. H10D 30/6758; H10P 14/6336; H10P 14/6339; H10P 14/6342; H10P 14/6682; H10P 14/683; H10P 14/69215; H10P 14/6927; H10P 14/69391; H10P 14/69433
See application file for complete search history.

(56) References Cited

U.S. PATENT DOCUMENTS

2017/0358682 A1 12/2017 Goto et al.
2018/0040739 A1 2/2018 Woo et al.
2018/0331130 A1 * 11/2018 Sun .................... H10D 86/0212
2023/0420573 A1 12/2023 Imamura et al.

OTHER PUBLICATIONS

Extended European Search Report issued Sep. 5, 2024, in European Patent Application No. 22771429.2, 6 pages.
Japanese Office Action issued Aug. 26, 2025 in Japanese Patent Application No. 2022-117340, 2 pgs.

* cited by examiner

FIG.1
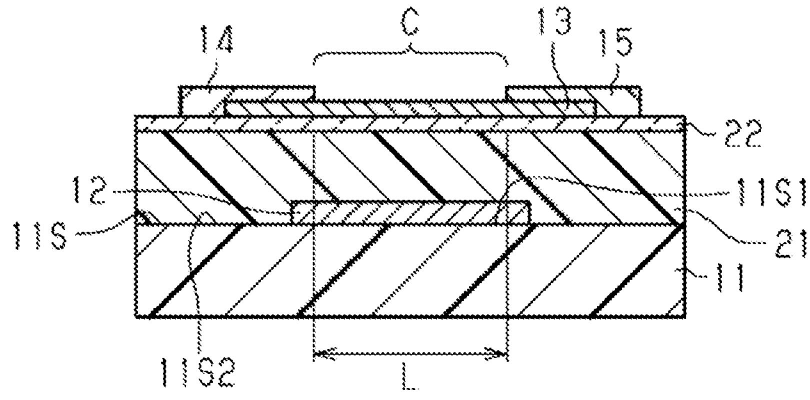
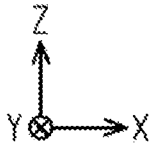
FIG.2
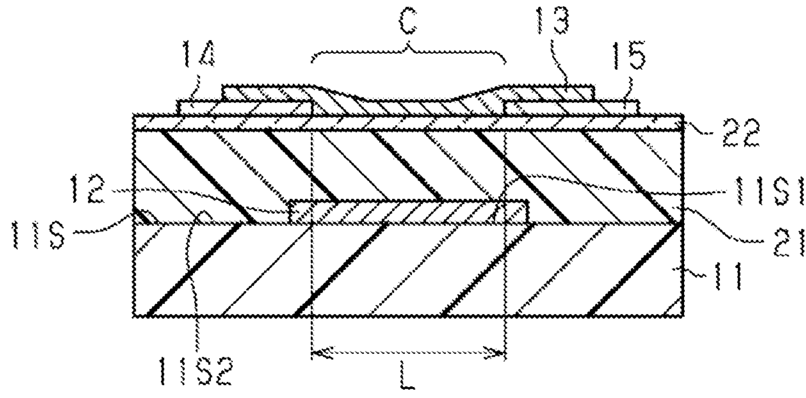

FIG.3

| | No. | FIRST GATE INSULATING COATING | | | SECOND GATE INSULATING COATING | | | | SEMICONDUCTOR LAYER | | | MOBILITY (cm²/Vs) | MOBILITY DECREASE RATE (%) | ON/OFF RATIO (NUMBER OF DIGITS) | ON/OFF RATIO DIFFERENCE (NUMBER OF DIGITS) |
|---|---|---|---|---|---|---|---|---|---|---|---|---|---|---|---|
| | | FILM THICKNESS T1 | YOUNG'S MODULUS E1 | T1E1 | MATERIAL | FILM THICK-NESS T2 | YOUNG'S MODULUS E2 | T2E2 | FILM THICK-NESS T3 | YOUNG'S MODULUS E3 | T3E3 | | | | |
| EXAMPLE 1- | 1 | 1500 | 20 | 30000 | SiN | 30 | 300 | 9000 | 50 | 150 | 7500 | 10.9 | 2.8 | 9 | 0 |
| | 2 | 1500 | 10 | 15000 | SiN | 30 | 300 | 9000 | 50 | 150 | 7500 | 10.9 | 2.8 | 9 | 0 |
| | 3 | 700 | 20 | 14000 | SiN | 30 | 300 | 9000 | 50 | 150 | 7500 | 10.8 | 1.9 | 9 | 0 |
| | 4 | 1500 | 3 | 4500 | SiN | 30 | 300 | 9000 | 50 | 150 | 7500 | 10.6 | 1.9 | 9 | 0 |
| | 5 | 100 | 20 | 2000 | SiN | 30 | 300 | 9000 | 50 | 150 | 7500 | 10.9 | 1.8 | 9 | 0 |
| | 6 | 1500 | 20 | 30000 | $Al_2O_3$ | 30 | 250 | 7500 | 50 | 150 | 7500 | 11.2 | 0.9 | 9 | 0 |
| | 7 | 1500 | 20 | 30000 | SiON | 30 | 150 | 4500 | 50 | 150 | 7500 | 10.5 | 1.9 | 9 | 0 |
| | 8 | 1500 | 20 | 30000 | SiN | 10 | 300 | 3000 | 50 | 150 | 7500 | 10.6 | 0.9 | 9 | 0 |
| | 9 | 1500 | 20 | 30000 | $SiO_2$ | 30 | 50 | 1500 | 50 | 150 | 7500 | 10.8 | 0.0 | 9 | 0 |
| | 10 | 1500 | 20 | 30000 | SiN | 2 | 300 | 600 | 50 | 150 | 7500 | 10.7 | 0.0 | 9 | 0 |
| | 11 | 1500 | 20 | 30000 | $SiO_2$ | 2 | 50 | 100 | 50 | 150 | 7500 | 10.8 | 0.0 | 9 | 0 |
| | 12 | 1500 | 20 | 30000 | SiN | 30 | 300 | 9000 | 50 | 120 | 6000 | 10.3 | 1.0 | 9 | 0 |
| | 13 | 1500 | 20 | 30000 | SiN | 30 | 300 | 9000 | 50 | 100 | 5000 | 10.9 | 0.9 | 9 | 0 |
| | 14 | 1500 | 20 | 30000 | SiN | 30 | 300 | 9000 | 30 | 150 | 4500 | 10.7 | 0.9 | 9 | 0 |
| | 15 | 1500 | 20 | 30000 | SiN | 30 | 300 | 9000 | 15 | 150 | 2250 | 10.7 | 0.0 | 9 | 0 |
| | 16 | 1500 | 20 | 30000 | SiN | 30 | 300 | 9000 | 15 | 100 | 1500 | 10.8 | 1.1 | 9 | 0 |
| | 17 | 1500 | 20 | 30000 | SiN | 30 | 300 | 9000 | 50 | 160 | 8000 | 11.0 | 10.9 | 9 | 0 |
| | 18 | 1500 | 20 | 30000 | SiN | 30 | 300 | 9000 | 60 | 150 | 9000 | 10.7 | 11.2 | 9 | 0 |
| | 19 | 1500 | 20 | 30000 | SiN | 30 | 300 | 9000 | 15 | 90 | 1350 | 10.2 | 13.0 | 9 | 0 |
| | 20 | 1500 | 20 | 30000 | SiN | 30 | 300 | 9000 | 10 | 140 | 1400 | 10.1 | 12.5 | 9 | 0 |

FIG.4

| | No. | FIRST GATE INSULATING COATING | | | SECOND GATE INSULATING COATING | | | | SEMICONDUCTOR LAYER | | | MOBILITY (cm2/Vs) | MOBILITY DECREASE RATE (%) | ON/OFF RATIO (NUMBER OF DIGITS) | ON/OFF RATIO DIFFERENCE (NUMBER OF DIGITS) |
|---|---|---|---|---|---|---|---|---|---|---|---|---|---|---|---|
| | | FILM THICK-NESS T1 | YOUNG'S MODULUS E1 | T1E1 | MATERIAL | FILM THICK-NESS T2 | YOUNG'S MODULUS E2 | T2E2 | FILM THICK-NESS T3 | YOUNG'S MODULUS E3 | T3E3 | | | | |
| COMPARATIVE EXAMPLE 1- | 1 | 90 | 20 | 1800 | SiN | 30 | 300 | 9000 | 50 | 150 | 7500 | 10.3 | * | 9 | * |
| | 2 | 1600 | 20 | 32000 | SiN | 30 | 300 | 9000 | 50 | 150 | 7500 | 10.1 | 88.1 | 9 | 5 |
| | 3 | 100 | 2 | 200 | SiN | 30 | 300 | 9000 | 50 | 150 | 7500 | 10.5 | * | 9 | * |
| | 4 | 1100 | 30 | 33000 | SiN | 30 | 300 | 9000 | 50 | 150 | 7500 | 10.6 | 95.3 | 9 | 6 |
| | 5 | 1500 | 20 | 30000 | $SiO_2$ | 1 | 90 | 90 | 50 | 150 | 7500 | 10.2 | 55.5 | 9 | 2 |
| | 6 | 1500 | 20 | 30000 | SiN | 40 | 300 | 12000 | 50 | 150 | 7500 | 10.9 | 93.5 | 9 | 6 |
| | 7 | 1500 | 20 | 30000 | $SiO_2$ | 2 | 40 | 80 | 50 | 150 | 7500 | 10.1 | 53.2 | 9 | 2 |
| | 8 | 1500 | 20 | 30000 | SiN | 30 | 320 | 9600 | 50 | 150 | 7500 | 10.8 | 90.6 | 9 | 6 |

FIG.5
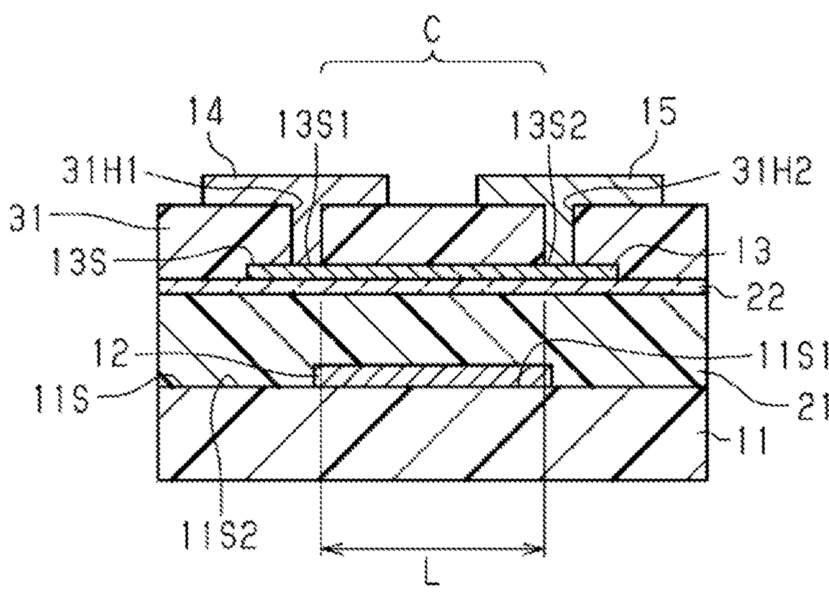
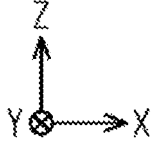
FIG.6
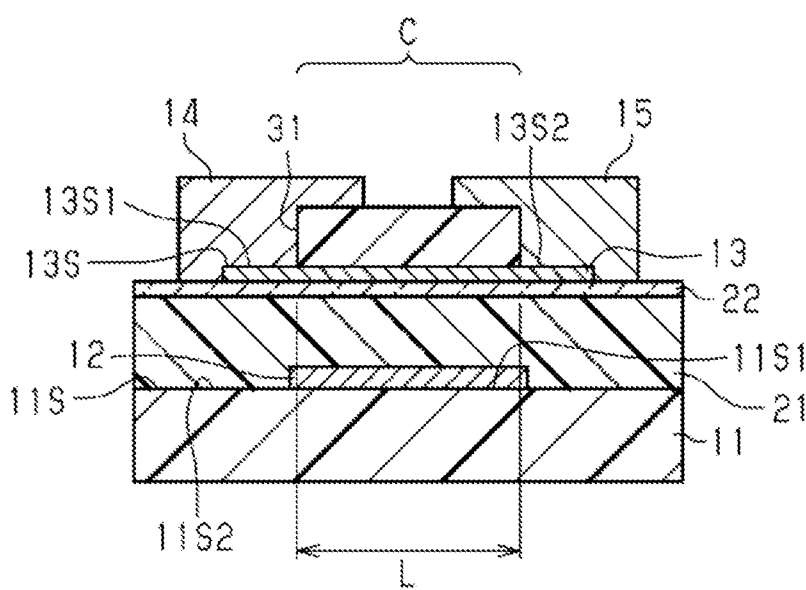
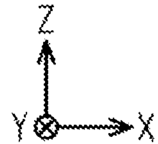

FIG.7

SECOND GATE INSULATING COATING

| | No. | STRUCTURE | FIRST GATE INSULATING COATING | | | | | | | SEMICONDUCTOR LAYER | | | PROTECTIVE LAYER | | | |
|---|---|---|---|---|---|---|---|---|---|---|---|---|---|---|---|---|
| | | | MATERIAL | FILM THICKNESS T1 | YOUNG'S MODULUS E1 | T1E1 | FILM THICKNESS T2 | YOUNG'S MODULUS E2 | T2E2 | FILM THICKNESS T3 | YOUNG'S MODULUS E3 | T3E3 | MATERIAL | FILM THICKNESS T4 | YOUNG'S MODULUS E4 | T4E4 |
| EXAMPLE 2 | 1 | Fig.5 | ACRYLIC POLYMER | 1500 | 20 | 30000 | 30 | 300 | 9000 | 50 | 150 | 7500 | PHOTOSENSITIVE ACRYLIC POLYMER | 40 | 3 | 120 |
| | 2 | Fig.5 | ACRYLIC POLYMER | 1500 | 20 | 30000 | 30 | 300 | 9000 | 50 | 150 | 7500 | PHOTOSENSITIVE ACRYLIC POLYMER | 50 | 5 | 250 |
| | 3 | Fig.5 | ACRYLIC POLYMER | 1500 | 20 | 30000 | 30 | 300 | 9000 | 50 | 150 | 7500 | PHOTOSENSITIVE ACRYLIC POLYMER | 100 | 10 | 1000 |
| | 4 | Fig.5 | ACRYLIC POLYMER | 1500 | 20 | 30000 | 30 | 300 | 9000 | 50 | 150 | 7500 | PHOTOSENSITIVE ACRYLIC POLYMER | 300 | 10 | 3000 |
| | 5 | Fig.5 | ACRYLIC POLYMER | 1500 | 20 | 30000 | 30 | 300 | 9000 | 50 | 150 | 7500 | PHOTOSENSITIVE ACRYLIC POLYMER | 500 | 15 | 7500 |
| | 6 | Fig.5 | ACRYLIC POLYMER | 1500 | 20 | 30000 | 30 | 300 | 9000 | 50 | 150 | 7500 | PHOTOSENSITIVE ACRYLIC POLYMER | 800 | 15 | 12000 |
| | 7 | Fig.5 | ACRYLIC POLYMER | 1500 | 20 | 30000 | 30 | 300 | 9000 | 50 | 150 | 7500 | PHOTOSENSITIVE ACRYLIC POLYMER | 1000 | 15 | 15000 |
| | 8 | Fig.5 | ACRYLIC POLYMER | 1500 | 20 | 30000 | 30 | 300 | 9000 | 50 | 150 | 7500 | PHOTOSENSITIVE ACRYLIC POLYMER | 1000 | 20 | 20000 |
| | 9 | Fig.5 | ACRYLIC POLYMER | 1500 | 20 | 30000 | 30 | 300 | 9000 | 50 | 150 | 7500 | PHOTOSENSITIVE CYCLOOLEFIN POLYMER | 1000 | 20 | 20000 |
| | 10 | Fig.5 | ACRYLIC POLYMER | 1500 | 20 | 30000 | 30 | 300 | 9000 | 50 | 150 | 7500 | PHOTOSENSITIVE ACRYLIC POLYMER | 1000 | 20 | 20000 |
| | 11 | Fig.5 | PHOTOSENSITIVE POLYMETHYL-SILSESQUIOXANE | 500 | 20 | 10000 | 30 | 300 | 9000 | 50 | 150 | 7500 | PHOTOSENSITIVE POLYMETHYLSILSESQUIOXANE | 500 | 20 | 10000 |
| | 12 | Fig.5 | ACRYLIC POLYMER/SiO2 NANOPARTICLES | 500 | 20 | 10000 | 30 | 300 | 9000 | 50 | 150 | 7500 | ACRYLIC POLYMER/SiO2 NANOPARTICLES | 500 | 20 | 10000 |
| | 13 | Fig.5 | ACRYLIC POLYMER | 1500 | 20 | 30000 | 30 | 300 | 9000 | 50 | 150 | 7500 | PHOTOSENSITIVE ACRYLIC POLYMER | 30 | 3 | 90 |
| | 14 | Fig.5 | ACRYLIC POLYMER | 1500 | 20 | 30000 | 30 | 300 | 9000 | 50 | 150 | 7500 | PHOTOSENSITIVE ACRYLIC POLYMER | 1200 | 20 | 24000 |
| | 15 | Fig.5 | ACRYLIC POLYMER | 1500 | 20 | 30000 | 30 | 300 | 9000 | 50 | 150 | 7500 | PHOTOSENSITIVE ACRYLIC POLYMER | 40 | 2 | 80 |
| | 16 | Fig.5 | ACRYLIC POLYMER | 1500 | 20 | 30000 | 30 | 300 | 9000 | 50 | 150 | 7500 | PHOTOSENSITIVE ACRYLIC POLYMER | 1000 | 30 | 30000 |
| | 17 | Fig.5 | ACRYLIC POLYMER | 1500 | 20 | 30000 | 30 | 300 | 9000 | 50 | 150 | 7500 | $SiO_2$ | 40 | 50 | 2000 |
| | 18 | Fig.5 | ACRYLIC POLYMER | 1500 | 20 | 30000 | 30 | 300 | 9000 | 50 | 150 | 7500 | SiN | 40 | 150 | 6000 |
| | 19 | Fig.5 | ACRYLIC POLYMER | 1500 | 20 | 30000 | 30 | 300 | 9000 | 50 | 150 | 7500 | SiN | 60 | 150 | 9000 |

FIG.8

| | No. | MOBILITY (cm2/Vs) | MOBILITY DECREASE RATE (%) | ON/OFF RATIO (NUMBER OF DIGITS) | ON/OFF RATIO DIFFERENCE (NUMBER OF DIGITS) |
|---|---|---|---|---|---|
| EXAMPLE 2- | 1 | 10.8 | 0.9 | 9 | 0 |
| | 2 | 10.9 | 0.0 | 9 | 0 |
| | 3 | 10.7 | 1.9 | 9 | 0 |
| | 4 | 10.9 | 0.9 | 9 | 0 |
| | 5 | 10.7 | 0.0 | 9 | 0 |
| | 6 | 10.9 | 0.9 | 9 | 0 |
| | 7 | 10.6 | 0.0 | 9 | 0 |
| | 8 | 10.7 | 1.9 | 9 | 0 |
| | 9 | 10.5 | 0.0 | 9 | 0 |
| | 10 | 10.8 | 0.9 | 9 | 0 |
| | 11 | 10.9 | 0.0 | 9 | 0 |
| | 12 | 10.7 | 1.9 | 9 | 0 |
| | 13 | 10.8 | 1.9 | 9 | 1 |
| | 14 | 10.7 | 0.0 | 9 | 1 |
| | 15 | 10.6 | 0.9 | 9 | 1 |
| | 16 | 10.9 | 0.9 | 9 | 1 |
| | 17 | 10.8 | 0.9 | 9 | 6 |
| | 18 | 10.2 | 0.0 | 9 | 6 |
| | 19 | 10.4 | 0.0 | 9 | 6 |

FIG.9

| | No. | STRUCTURE | FIRST GATE INSULATING COATING | | | | SECOND GATE INSULATING COATING | | |
|---|---|---|---|---|---|---|---|---|---|
| | | | MATERIAL | FILM THICK -NESS T1 | YOUNG'S MODULUS E1 | T1E1 | FILM THICK -NESS T2 | YOUNG'S MODULUS E2 | T2E2 |
| COMPARATIVE EXAMPLE 2- | 1 | Fig.5 | ACRYLIC POLYMER | 1500 | 20 | 30000 | 30 | 300 | 9000 |
| | 2 | Fig.5 | ACRYLIC POLYMER | 1500 | 20 | 30000 | 30 | 300 | 9000 |

FIG.10

| | No. | SEMICONDUCTOR LAYER | | | PROTECTIVE LAYER | | | |
|---|---|---|---|---|---|---|---|---|
| | | FILM THICKNESS T3 | YOUNG'S MODULUS E3 | T3E3 | MATERIAL | FILM THICKNESS T4 | YOUNG'S MODULUS E4 | T4E4 |
| COMPARATIVE EXAMPLE 2- | 1 | 50 | 150 | 7500 | $SiO_2$ | 150 | 70 | 10500 |
| | 2 | 50 | 150 | 7500 | SiN | 80 | 150 | 12000 |

FIG.11

| | No. | MOBILITY (cm2/Vs) | MOBILITY DECREASE RATE (%) | ON/OFF RATIO (NUMBER OF DIGITS) | ON/OFF RATIO DIFFERENCE (NUMBER OF DIGITS) |
|---|---|---|---|---|---|
| COMPARATIVE EXAMPLE 2- | 1 | 10.5 | 69.6 | 9 | 6 |
| | 2 | 10.3 | 80.4 | 9 | 7 |

THIN FILM TRANSISTOR AND METHOD OF MANUFACTRUTING THIN FILM TRANSISTOR

CROSS-REFERENCE TO RELATED APPLICATIONS

The present application is a continuation of and claims the benefit of priority to International Application No. PCT/JP2022/011584, filed Mar. 15, 2022, which is based upon and claims the benefit of priority to Japanese Application No. 2021-041758, filed Mar. 15, 2021 and Japanese Application No. 2021-134322, filed Aug. 19, 2021. The entire contents of these applications are incorporated herein by reference.

BACKGROUND OF THE INVENTION

Field of the Invention

The present invention relates to a thin film transistor including, as a gate insulating layer, a laminate of a first gate insulating coating made of an organic polymer compound or an organic-inorganic composite material and a second gate insulating coating made of an inorganic silicon compound, and a method for manufacturing the thin film transistor.

Description of Background Art

JP 2010-21264 A describes a thin film transistor having a gate insulating layer including an organic polymer compound film and an inorganic silicon compound film. The entire contents of this publication are incorporated herein by reference.

SUMMARY OF THE INVENTION

According to one aspect of the present invention, a thin film transistor includes a flexible substrate having a support surface, a gate electrode layer formed in a first part of the support surface of the flexible substrate, a gate insulating layer covering the gate electrode layer and a second part of the support surface of the flexible substrate, a semiconductor layer formed such that the semiconductor layer and the gate electrode layer are sandwiching the gate insulating layer, a source electrode layer formed in contact with a first end of the semiconductor layer such that no insulating layer is formed between the source electrode layer and the semiconductor layer, and a drain electrode layer formed in contact with a second end of the semiconductor layer such that no insulating layer is formed between the drain electrode layer and the semiconductor layer. The gate insulating layer includes a first gate insulating coating and a second gate insulating coating such that the first gate insulating coating includes an organic polymer compound or an organic-inorganic composite material and is covering the second part and the gate electrode layer and that the second gate insulating coating includes one compound selected from a group of silicon oxide, silicon nitride, silicon oxynitride, and aluminum oxide and is sandwiched between the first gate insulating coating and the semiconductor layer, the first gate insulating coating has a thickness in the range of 100 nm to 1500 nm and a product of the thickness and Young's modulus in the range of 300 nm·GPa to 30000 nm·GPa, and the second gate insulating coating has a thickness in the range of 2 nm to 30 nm and a product of the thickness and Young's modulus of the second gate insulating coating in the range of 100 nm·GPa to 9000 nm·GPa.

According to another aspect of the present invention, a thin film transistor includes a flexible substrate having a support surface, a gate electrode layer located in a first part of the support surface of the flexible substrate, a gate insulating layer covering the gate electrode layer and a second part of the support surface of the flexible substrate, a semiconductor layer formed such that the semiconductor layer and the gate electrode layer are sandwiching the gate insulating layer, a protective layer formed such that the protective layer is covering the semiconductor layer and exposing first and second regions on an upper surface of the semiconductor layer, a source electrode layer formed such that the source electrode layer is in contact with the first region on the upper surface of the semiconductor layer, and a drain electrode layer formed such that the drain electrode layer is in contact with the second region on the upper surface of the semiconductor layer. The protective layer includes an organic polymer compound or an organic-inorganic composite material, the gate insulating layer includes a first gate insulating coating and a second gate insulating coating such that the first gate insulating coating includes an organic polymer compound or an organic-inorganic composite material and is covering the second part and the gate electrode layer and that the second gate insulating coating includes one compound selected from a group of silicon oxide, silicon nitride, silicon oxynitride, and aluminum oxide and is sandwiched between the first gate insulating coating and the semiconductor layer, the first gate insulating coating has a thickness in the range of 100 nm to 1500 nm and a product of the thickness and Young's modulus in the range of 300 nm·GPa to 30000 nm·GPa, and the second gate insulating coating has a thickness in the range of 2 nm to 30 nm and a product of the thickness and Young's modulus of the second gate insulating coating in the range of 100 nm·GPa to 9000 nm·GPa.

According to yet another aspect of the present invention, a thin film transistor includes a flexible substrate having a support surface, a gate electrode layer located in a first part of the support surface of the flexible substrate, a gate insulating layer covering the gate electrode layer and a second part of the support surface of the flexible substrate, a semiconductor layer formed such that the semiconductor layer and the gate electrode layer are sandwiching the gate insulating layer, a protective layer formed such that the protective layer is covering the semiconductor layer and exposing first and second regions on an upper surface of the semiconductor layer, a source electrode layer formed such that the source electrode layer is in contact with the first region on the upper surface of the semiconductor layer, and a drain electrode layer formed such that the drain electrode layer is in contact with the second region on the upper surface of the semiconductor layer. The protective layer includes silicon oxide, silicon nitride or silicon oxynitride, the gate insulating layer includes a first gate insulating coating and a second gate insulating coating such that the first gate insulating coating includes an organic polymer compound or an organic-inorganic composite material and is covering the second part and the gate electrode layer and that the second gate insulating coating includes one compound selected from a group of silicon oxide, silicon nitride, silicon oxynitride, and aluminum oxide and is sandwiched between the first gate insulating coating and the semiconductor layer, the first gate insulating coating has a thickness in the range of 100 nm to 1500 nm and a product of the thickness and Young's modulus in the range of 300 nm·GPa to 30000 nm·GPa, and the second gate insulating coating has a thickness in the range of 2 nm to nm and a product of the thickness and Young's modulus of the second gate insulating coating in the range of 100 nm·GPa to 9000 nm·GPa.

According to yet another aspect of the present invention, a method of manufacturing a thin film transistor includes forming a gate electrode layer on a first part of a support surface of a flexible substrate, forming a gate insulating layer covering the gate electrode layer and a second part of the support surface of the flexible substrate, forming a semiconductor layer such that the semiconductor layer and the gate electrode layer are sandwiching the gate insulating layer, forming a source electrode layer such that the source electrode layer is in contact with a first end of the semiconductor layer and no insulating layer is formed between the source electrode layer and the semiconductor layer, and forming a drain electrode layer such that the drain electrode layer is in contact with a second end of the semiconductor layer and that no insulating layer is formed between the drain electrode layer and the semiconductor layer. The forming of the gate insulating layer includes forming, by a coating method, a first gate insulating coating including an organic polymer compound or an organic-inorganic composite material such that the first gate insulating coating covers the second part and the gate electrode layer, and forming a second gate insulating coating including one compound selected from a group of silicon oxide, silicon nitride, silicon oxynitride, and aluminum oxide such that the second gate insulating coating is sandwiched between the first gate insulating coating and the semiconductor layer, the first gate insulating coating is formed such that the first gate insulating coating has a thickness in the range of 100 nm to 1500 nm and a product of the thickness and Young's modulus of the first gate insulating coating is in the range of 300 nm·GPa to 30000 nm·GPa, and the second gate insulating coating is formed such that the second gate insulating coating has a thickness in the range of 2 nm to 30 nm and a product of the thickness and Young's modulus of the second gate insulating coating is in the range of 100 nm·GPa to 9000 nm·GPa.

According to still another aspect of the present invention, a method of manufacturing a thin film transistor includes forming a gate electrode layer on a first part of a support surface of a flexible substrate, forming a gate insulating layer covering the gate electrode layer and a second part of the support surface of the flexible substrate, forming a semiconductor layer such that the semiconductor layer and the gate electrode layer are sandwiching the gate insulating layer, forming a protective layer including an organic polymer compound or an organic-inorganic composite material such that the protective layer exposes first and second regions on an upper surface of the semiconductor layer, and forming a source electrode layer such that the source electrode layer is in contact with the first region on the upper surface of the semiconductor layer, and forming a drain electrode layer such that the drain electrode layer is in contact with the second region on the upper surface of the semiconductor layer. The forming of the gate insulating layer includes forming, by a coating method, a first gate insulating coating including an organic polymer compound or an organic-inorganic composite material such that the first gate insulating coating covers the second part and the gate electrode layer, and forming a second gate insulating coating including one compound selected from a group of silicon oxide, silicon nitride, silicon oxynitride, and aluminum oxide such that the second gate insulating coating is sandwiched between the first gate insulating coating and the semiconductor layer, the first gate insulating coating is formed such that the first gate insulating coating has a thickness in the range of 100 nm to 1500 nm and a product of the thickness and Young's modulus of the first gate insulating coating is in the range of 300 nm·GPa to 30000 nm·GPa, and the second gate insulating coating is formed such that the second gate insulating coating has a thickness in the range of 2 nm to 30 nm and a product of the thickness and Young's modulus of the second gate insulating coating is in the range of 100 nm·GPa to 9000 nm·GPa.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view showing a first example of a multilayer structure of a thin film transistor according to a first embodiment of the present invention;

FIG. 2 is a cross-sectional view showing a second example of the multilayer structure of the thin film transistor according to the first embodiment of the present invention;

FIG. 3 is a table showing the relationship between the structure of layers, the mobility decrease rate, and the on/off ratio difference for each Example;

FIG. 4 is a table showing the relationship between the structure of layers, the mobility decrease rate, and the on/off ratio difference for each Comparative Example;

FIG. 5 is a cross-sectional view showing a third example of a multilayer structure of a thin film transistor according to a second embodiment of the present invention;

FIG. 6 is a cross-sectional view showing a fourth example of a multilayer structure of a thin film transistor according to the second embodiment of the present invention;

FIG. 7 is a table showing the structure of layers of each Example;

FIG. 8 is a table showing the structure of layers, the mobility decrease rate, and the on/off ratio difference of each Example;

FIG. 9 is a table showing the structure of layers of each Comparative Example;

FIG. 10 is a table showing the structure of layers of each Comparative Example; and FIG. 11 is a table showing the structure of layers, the mobility decrease rate, and the on/off ratio difference of each Example.

DETAILED DESCRIPTION OF THE EMBODIMENTS

Embodiments will now be described with reference to the accompanying drawings, wherein like reference numerals designate corresponding or identical elements throughout the various drawings.

First Embodiment

A thin film transistor and a method of manufacturing a thin film transistor according to first embodiment of the present invention will be described below. First, the multilayer structure of the thin film transistor will be described, then the constituent materials and dimensions of each layer of the thin film transistor will be described, and finally the method of manufacturing the thin film transistor will be described.

Note that FIG. 1 shows a first example of a multilayer structure of a thin film transistor, and FIG. 2 shows a second example of a multilayer structure of a thin film transistor. In the following, the upper and lower surfaces of each component of the thin film transistor will be described assuming it is oriented as in FIGS. 1 and 2.

In addition, since the source and the drain in the thin film transistor are determined according to the operation of the driver circuit of the thin film transistor, a first electrode layer may change its function from source to drain, and a second electrode layer may change its function from drain to source.

Multilayer Structure

As shown in FIG. 1, the first example of a thin film transistor is a bottom-gate top-contact transistor. The thin film transistor includes a flexible substrate 11, a gate electrode layer 12, a first gate insulating coating 21, a second gate insulating coating 22, a semiconductor layer 13, a source electrode layer 14, and a drain electrode layer 15. The first gate insulating coating 21 and the second gate insulating coating 22 form a gate insulating layer.

The flexible substrate 11 and the gate electrode layer 12 are formed in a channel depth direction Z, which is the upward direction in FIG. 1. The source electrode layer 14 and the drain electrode layer 15 are formed in a channel length direction X, which is toward the right in FIG. 1. The channel width direction Y is orthogonal to the channel length direction X and the channel depth direction Z.

The upper surface of the flexible substrate 11 is a support surface 11S extending in the channel length direction X and the channel width direction Y. The support surface 11S includes a first part 11S1 and a second part 11S2 that are in contact with each other in the channel length direction X. The area of the first part 11S1 is less than that of the second part 11S2. The first part 11S1 is in contact with the lower surface of the gate electrode layer 12. The second part 11S2 is in contact with part of the lower surface of the first gate insulating coating 21.

The first gate insulating coating 21 is in contact with the upper surface of the gate electrode layer 12. The first gate insulating coating 21 may either cover the entire support surface 11S or part of the support surface 11S.

The lower surface of the second gate insulating coating 22 is in contact with the upper surface of the first gate insulating coating 21. The second gate insulating coating 22 may either cover the entire first gate insulating coating 21 or part of the first gate insulating coating 21. The second gate insulating coating 22 covers the upper surface of the gate electrode layer 12 so that the first gate insulating coating 21 is sandwiched between the second gate insulating coating 22 and the gate electrode layer 12.

The lower surface of the semiconductor layer 13 is in contact with the upper surface of the second gate insulating coating 22. The semiconductor layer 13 covers the upper surface of the gate electrode layer 12 so that the first gate insulating coating 21 and the second gate insulating coating 22 are sandwiched between the semiconductor layer 13 and the gate electrode layer 12. In the channel length direction X, the semiconductor layer 13 is longer than the gate electrode layer 12.

A first part of the lower surface of the source electrode layer 14 is in contact with the upper surface of the semiconductor layer 13. In the channel depth direction Z, there is no insulating layer between the source electrode layer 14 and the semiconductor layer 13. A second part of the lower surface of the source electrode layer 14 is in contact with the upper surface of the second gate insulating coating 22. The source electrode layer 14 covers a first end of the semiconductor layer 13 so that it is connected to the first end of the semiconductor layer 13 in the channel length direction X.

A first part of the lower surface of the drain electrode layer 15 is in contact with the upper surface of the semiconductor layer 13. In the channel depth direction Z, there is no insulating layer between the drain electrode layer 14 and the semiconductor layer 13. A second part of the lower surface of the drain electrode layer 15 is in contact with the upper surface of the second gate insulating coating 22. The drain electrode layer 15 covers a second end of the semiconductor layer 13 so that it is connected to the second end of the semiconductor layer 13 in the channel length direction X.

The source electrode layer 14 and the drain electrode layer 15 are separated from each other. A distance L between the source electrode layer 14 and the drain electrode layer 15 in the channel length direction X is less than the length of the gate electrode layer 12. In this case, the region of the semiconductor layer 13 between the source electrode layer 14 and the drain electrode layer 15 is a channel region C. The length of the channel region C in the channel length direction X, that is, the distance L between the source electrode layer 14 and the drain electrode layer 15 is the channel length. The length of the channel region C in the channel width direction Y is the channel width.

When the channel length of a thin film transistor varies depending on the position in the channel width direction Y, the average value of all the channel lengths is the channel length of that thin film transistor. When the distance L is greater than the length of the gate electrode layer 12, the channel region C is the region of the semiconductor layer 13 that overlaps the gate electrode layer 12 in the channel depth direction Z.

As shown in FIG. 2, the second example of a thin film transistor is a bottom-gate bottom-contact transistor. The differences of the bottom-gate bottom-contact transistor structure from the bottom-gate top-contact transistor structure will be mainly described below.

The lower surface of the source electrode layer 14 is in contact with the upper surface of the second gate insulating coating 22. The lower surface of the drain electrode layer 15 is in contact with the upper surface of the second gate insulating coating 22.

A first part of the lower surface of the semiconductor layer 13 is in contact with the second gate insulating coating 22. A second part of the lower surface of the semiconductor layer 13 forms the channel region C filling the gap between the source electrode layer 14 and the drain electrode layer 15 in the channel length direction X.

The first end of the semiconductor layer 13, which is the end of the lower surface thereof in the channel length direction X, covers the upper surface of the source electrode layer 14 so that the first end is in contact with the upper surface of the source electrode layer 14. In the channel depth direction Z, there is no insulating layer between the source electrode layer 14 and the semiconductor layer 13. The second end of the semiconductor layer 13, which is the end of the lower surface thereof in the channel length direction X, covers the upper surface of the drain electrode layer 15 so that the second end is in contact with the upper surface of the drain electrode layer 15. In the channel depth direction Z, there is no insulating layer between the drain electrode layer 15 and the semiconductor layer 13.

Flexible Substrate

The flexible substrate 11 has an insulating upper surface. The flexible substrate 11 may be a transparent substrate or an opaque substrate. The flexible substrate 11 may be an insulating coating, a metal foil having an insulating support surface 11S, an alloy foil having an insulating support surface 11S, or a flexible thin glass plate.

The material forming the flexible substrate 11 is at least one selected from organic polymer compounds, organic-inorganic composite materials, which are composite materials of organic and inorganic materials, metals, alloys, and inorganic polymer compounds.

The flexible substrate 11 may have a single-layer structure or a multilayer structure. When the flexible substrate 11 has a multilayer structure, the material of each of the layers forming the flexible substrate 11 is one selected from organic polymer compounds, composite materials, metals, alloys, and inorganic polymer compounds.

When the flexible substrate 11 has a multilayer structure, the flexible substrate 11 may include a base substrate and a release layer that can be peeled off from the base substrate. The release layer is peeled off from the base substrate together with the device structure. The release layer provided with the device structure may be attached to another flexible substrate. Examples of flexible substrates include paper with low heat resistance, cellophane substrates, cloth, recycled fibers, leather, nylon substrates, and polyurethane substrates. In this example, the release layer and the flexible substrate forms another flexible substrate 11.

The organic polymer compound is at least one selected from polymethyl methacrylate, polyacrylate, polycarbonate, polystyrene, polyethylene sulfide, polyether sulfone, polyolefin, polyethylene terephthalate, polyethylene naphthalate, cycloolefin polymer, polyether sulphene, triacetyl cellulose, polyvinyl fluoride, ethylene-tetrafluoroethylene copolymers, polyimide, fluorine polymers, and cyclic polyolefin polymers.

The composite material is a glass fiber reinforced acrylic polymer or glass fiber reinforced polycarbonate. The metal is aluminum or copper. The alloy is an iron-chromium alloy, an iron-nickel alloy, or an iron-nickel-chromium alloy. The inorganic polymer compound is an alkali-free glass or alkali glass. Alkali-free glass includes silicon oxide, boron oxide, and aluminum oxide. Alkali glass includes silicon oxide, sodium oxide, and calcium oxide.

Electrode Layer

The electrode layers 12, 14, and 15 may have a single-layer structure or a multilayer structure. When the electrode layers 12, 14, and 15 have a multilayer structure, each of them preferably includes a bottom layer for enhancing the adhesion with the layer below the electrode layer 12, 14, or 15 and a top layer for enhancing the adhesion with the layer above the electrode layer 12, 14, or 15.

The material of each electrode layer 12, 14, 15 may be a metal, an alloy, or a conductive metal oxide. The materials of the electrode layers 12, 14, and 15 may be different from each other or the same.

The metal is at least one of transition metals, alkali metals, and alkaline earth metals. The transition metal is at least one selected from indium, aluminum, gold, silver, platinum, titanium, copper, nickel, and tungsten. The alkali metal is lithium or cesium. The alkaline earth metal is at least one of magnesium and calcium. The alloy is one selected from molybdenum-niobium (MoNb), iron-chromium, aluminum-lithium, magnesium-silver, aluminum-neodymium alloy, and aluminum-neodymium-zirconia alloy.

The metal oxide is one selected from indium oxide, tin oxide, zinc oxide, cadmium oxide, indium cadmium oxide, cadmium tin oxide, and zinc tin oxide. The metal oxide may contain impurities. The metal oxide containing impurities is indium oxide containing at least one impurity selected from tin, zinc, titanium, cerium, hafnium, zirconia, and molybdenum. The metal oxide containing impurities may be tin oxide containing antimony or fluorine. The metal oxide containing impurities may be zinc oxide containing at least one impurity selected from gallium, aluminum, and boron.

When the material forming the semiconductor layer 13 is a metal oxide, the electrode layers 14 and 15 may be made of the same constituent elements as the semiconductor layer 13 and have an impurity concentration sufficiently higher than that of the semiconductor layer 13.

In order to expand the range of materials that can be applied to the electrode layers 12, 14, and 15, the electrical resistivity of the electrode layers 12, 14, and 15 is preferably $5.0\times10^{-5}$ Ω·cm or higher. In order to suppress the power consumption of the thin film transistor, the electrical resistivity of the electrode layers 12, 14, and 15 is preferably $1.0\times10^{-2}$ Ω·cm or lower.

In order to suppress the electric resistance of the electrode layers 12, 14, and 15, the thickness of each of the electrode layers 12, 14, and 15 is preferably 50 nm or greater. In order to improve the flatness of the layers constituting the thin film transistor, the thickness of each of the electrode layers 12, 14, and 15 is preferably 300 nm or less.

Insulating Coating

The material forming the first gate insulating coating 21 is, for example, an organic polymer compound. The organic polymer compound is at least one selected from polyvinylphenol, polyimide, polyvinyl alcohol, acrylic polymers, epoxy polymers, fluoropolymers including amorphous fluoropolymers, melamine polymers, furan polymers, xylene polymers, polyamideimide polymers, silicone polymers, and cycloolefin polymers. In order to increase the heat resistance of the first gate insulating coating 21, the organic polymer compound is preferably at least one selected from polyimide, acrylic polymers, and fluorine polymers.

The material forming the first gate insulating coating 21 may be an organic-inorganic composite material. The organic-inorganic composite material may be, for example, a mixture of particles of an organic polymeric compound and inorganic compound. Note that particles of an inorganic compound are nanoparticles, that is, particles having a size within the range of several nanometers to several hundreds of nanometers.

Alternatively, the organic-inorganic composite material may have a molecular structure including an atomic group having the properties of an organic compound and an atomic group having the properties of an inorganic compound. An example of such an organic-inorganic composite material is a silsesquioxane. The molecular structure of silsesquioxanes has a skeleton formed of silicon and oxygen that is an atomic group having the property of an inorganic compound, and an organic group as an atomic group having the property of an organic compound.

An organic-inorganic composite material can combine the properties of an organic polymer compound and the properties of an inorganic compound. Therefore, for example, an organic-inorganic composite material can combine flex resistance and impact resistance, which are characteristics of organic polymer compounds, with heat resistance and durability, which are characteristics of inorganic compounds.

The first gate insulating coating 21 may be a single layer coating or a multilayer coating. When the first gate insulating coating 21 is a multilayer coating, the material of each of the layers constituting the first gate insulating coating 21 is an organic polymer compound or an organic-inorganic composite material.

In order to suppress current leakage between the gate electrode layer 12 and the other electrode layers 14 and 15, the thickness of the first gate insulating coating 21 is preferably 100 nm or greater. In order to reduce the gate voltage for driving the thin film transistor, the thickness of the first gate insulating coating 21 is preferably 1500 nm or less. Further, in order to improve the effectiveness of obtaining these effects, improve the uniformity of the thickness of the first gate insulating coating 21, and improve the productivity of the first gate insulating coating 21, the thickness of the first gate insulating coating 21 is more preferably 400 nm or greater and 1000 nm or less.

The Young's modulus of the first gate insulating coating 21 is 3 GPa or greater and 20 GPa or less. When the Young's modulus of the first gate insulating coating 21 is 3 GPa or greater, deterioration of the film quality of the first gate insulating coating 21 is suppressed, which in turn suppresses a decrease in withstand voltage. When the Young's modulus of the first gate insulating coating 21 is 20 GPa or less, deterioration of the bendability of the first gate insulating coating 21 is suppressed. The Young's modulus of the first gate insulating coating 21 is a value measured by a method conforming to ISO 14577.

In order to secure sufficient insulation between the gate electrode layer 12 and the source electrode layer 14, and sufficient insulation between the gate electrode layer 23 and the drain electrode layer 15, the resistivity of the first gate insulating coating 21 is preferably $1\times10^{11}$ Ω·cm or higher, more preferably $1\times10^{13}$ Ω·cm or higher.

The material forming the second gate insulating coating 22 is, for example, an inorganic silicon compound having no long-range order. The inorganic silicon compound is at least one selected from silicon oxide, silicon nitride, and silicon oxynitride. Elements constituting silicon oxide include oxygen, silicon, and hydrogen. Elements constituting silicon nitride include nitrogen, silicon, and hydrogen. Elements constituting silicon oxynitride include oxygen, nitrogen, silicon, and hydrogen. The material forming the second gate insulating coating 22 may be aluminum oxide. Elements constituting aluminum oxide include oxygen and aluminum.

The second gate insulating coating 22 may be a single-layer coating or a multilayer coating. When the second gate insulating coating 22 is a multilayer film, the material of each of the layers forming the second gate insulating coating 22 is one selected from silicon oxide, silicon nitride, silicon oxynitride, and aluminum oxide. The second gate insulating coating 22 preferably has a resistivity of $1\times10^{11}$Ω or higher, more preferably $1\times10^{13}$Ω or higher.

The Young's modulus of the second gate insulating coating 22 is 50 GPa or greater and 300 GPa or less. When the Young's modulus of the second gate insulating coating 22 is 50 GPa or greater, deterioration of the film quality of the second gate insulating coating 22 is suppressed, which in turn suppresses a decrease in mobility in the thin film transistor. When the Young's modulus of the second gate insulating coating 22 is 300 GPa or less, deterioration of the flex resistance is suppressed. Similarly to the Young's modulus of the first gate insulating coating 21, the Young's modulus of the second gate insulating coating 22 is a value measured by a method conforming to ISO14577.

A thin film transistor according to an embodiment of the present invention satisfies the following Conditions 1 and 2.

Condition 1: The thickness of the first gate insulating coating 21 is within the range of 100 nm or greater and 1500 nm or less, and the product of the thickness and Young's modulus of the first gate insulating coating 21 is within the range of 300 nm·GPa or greater and 30000 nm·GPa or less.

Condition 2: The thickness of the second gate insulating coating 22 is within the range of 2 nm or greater and 30 nm or less, and the product of the thickness and Young's modulus of the second gate insulating coating 22 is within the range of 100 nm·GPa or greater and 9000 nm·GPa or less.

When the first gate insulating coating 21 satisfies Condition 1, deterioration of the film quality of the first gate insulating coating 21 is suppressed, which in turn suppresses a decrease in withstand voltage due to bending. In particular, in cases where the second gate insulating coating 22 is formed by a film formation method using plasma, the effect of plasma damage on the film quality of the first gate insulating coating 21 is suppressed, which in turn suppresses a decrease in insulation due to bending.

In addition, when the first gate insulating coating 21 satisfies Condition 1, it is possible to suppress an increase in the strain energy generated in the first gate insulating coating 21 when it is bent and a decrease in the deformability of the first gate insulating coating 21. This prevents the first gate insulating coating 21 and the second gate insulating coating 22 from cracking and the adhesion between the first gate insulating coating 21 and the second gate insulating coating 22 deteriorating.

When the second gate insulating coating 22 satisfies Condition 2, deterioration of the film quality of the second gate insulating coating 22 is suppressed, which in turn prevents the state of the interface between the second gate insulating coating 22 and the semiconductor layer 13 becoming unstable. When the thickness of the second gate insulating coating 22 is 2 nm or greater, scattered islands of the second gate insulating coating 22 will not be formed. This ensures formation of a continuous coating.

In addition, when the second gate insulating coating 22 satisfies Condition 2, it is possible to suppress an increase in the strain energy generated in the second gate insulating coating 22 when it is bent and a decrease in the deformability of the second gate insulating coating 22. This prevents the adhesion between the second gate insulating coating 22 and the semiconductor layer 13 deteriorating.

Thus, when the first gate insulating coating 21 satisfies Condition 1 and the second gate insulating coating 22 satisfies Condition 2, even when the thin film transistor is bent, the first gate insulating coating 21 and the second gate insulating coating 22 themselves do not deteriorate, and also the state of the interface between the first gate insulating coating 21 and the second gate insulating coating 22 does not deteriorate. This reduces the decrease in mobility caused by the thin film transistor being bent. As a result, it is possible to improve the electrical durability of the thin film transistor against bending of the flexible substrate.

Semiconductor Layer

The material of the semiconductor layer 13 may be an inorganic semiconductor or an organic semiconductor. The inorganic semiconductor may be an oxide semiconductor, non-monocrystalline silicon, or a compound semiconductor. The non-monocrystalline silicon may be amorphous silicon or polycrystalline silicon. The oxide semiconductor contains at least one of indium and zinc.

In order to increase the light transmittance and field-effect mobility (hereinafter also referred to as mobility) of the semiconductor layer 13, the semiconductor layer 13 is preferably an amorphous oxide semiconductor layer containing indium. The oxide semiconductor is more preferably an In-M-Zn oxide. An In-M-Zn oxide contains indium (In) and zinc (Zn), and also includes at least one metal element (M) selected from aluminum, titanium, gallium (Ga), germanium, yttrium, zirconium, lanthanum, cerium, hafnium, and tin.

In order to improve the uniformity of the thickness of the semiconductor layer 13, the thickness of the semiconductor layer 13 is preferably 15 nm or greater. In order to reduce the amount of material for forming the semiconductor layer 13, the thickness of the semiconductor layer 13 is preferably 100 nm or less. In order to achieve both improved thickness uniformity and reduced amount of material used, the thickness of the semiconductor layer 13 is preferably 15 nm or greater and 100 nm or less. Further, in order to enhance the effectiveness of obtaining these effects, the thickness of the semiconductor layer 13 is more preferably 15 nm or greater and 50 nm or less.

In order to increase the mobility in the thin film transistor, the conductivity of the semiconductor layer is preferably $1.0\times10^{-7}$ S/cm or higher and $1.0\times10^{-1}$ S/cm or lower.

The Young's modulus of the semiconductor layer 13 is preferably 100 GPa or greater and 150 GPa or less. When the Young's modulus of the semiconductor layer 13 is 100 GPa or greater, deterioration of the film quality of the semiconductor layer 13 is suppressed, which in turn suppresses a decrease in mobility in the thin film transistor. When the Young's modulus of the semiconductor layer 13 is 150 GPa or less, deterioration of the flex resistance is suppressed. Similarly to the Young's modulus of the first gate insulating coating 21, the Young's modulus of the semiconductor layer 13 is a value measured by a method conforming to ISO14577.

The semiconductor layer 13 preferably satisfies the following Condition 3.

(Condition 3) The thickness of the semiconductor layer 13 is within the range of 15 nm or greater and 50 nm or less, and the product of the thickness and Young's modulus is within the range of 1500 nm·GPa or greater and 7500 nm·GPa or less.

When the semiconductor layer 13 satisfies Condition 3, deterioration of the film quality of the semiconductor layer 13 is suppressed, which in turn prevents the interface between the semiconductor layer 13 and the second gate insulating coating 22 from becoming unstable. In addition, when the semiconductor layer 13 satisfies Condition 3, it is possible to suppress an increase in the strain energy generated in the semiconductor layer 13 when it is bent and a decrease in the deformability of the semiconductor layer 13. This prevents the adhesion between the semiconductor layer 13 and the second gate insulating coating 22 deteriorating. As a result, the decrease in mobility caused by the thin film transistor being bent can be further reduced.

Accordingly, when the semiconductor layer 13 satisfies Condition 3, it is possible to prevent the semiconductor layer 13 itself from deteriorating and the state of the interface between the semiconductor layer 13 and the second gate insulating coating 22 deteriorating when the thin film transistor is bent. This further reduces the decrease in mobility due to bending of the thin film transistor. As a result, it is possible to further improve the electrical durability of the thin film transistor against bending of the flexible substrate.

Method of Manufacturing Thin Film Transistor

A method of manufacturing a bottom-gate top-contact transistor includes a first step of forming the gate electrode layer 12 on the flexible substrate 11, a second step of laminating the first gate insulating coating 21 on the gate electrode layer 12, and a third step of laminating the 20 second gate insulating coating 22 on the first gate insulating coating 21. The method of manufacturing a bottom-gate top-contact transistor also includes a fourth step of laminating the semiconductor layer 13 on the second gate insulating coating 22, and a fifth step of laminating the source electrode layer 14 and the drain electrode layer 15 on the semiconductor layer 13.

Note that, in a method of manufacturing a bottom-gate bottom-contact transistor, in the fourth step, the source electrode layer 14 and the drain electrode layer 15 are laminated on the second gate insulating coating 22. In the fifth step, the semiconductor layer 13 is laminated on the source electrode layer 14, the drain electrode layer 15, and the second gate insulating coating 22. In the fourth step, the method used in the fifth step of the method of manufacturing a bottom-gate top-contact transistor is used. In the fifth step, the method used in the fourth step of the method of manufacturing a bottom-gate top-contact transistor is used. Therefore, the method of manufacturing a bottom-gate top-contact transistor will be mainly described below, and redundant description of the method of manufacturing a bottom-gate bottom-contact transistor will be omitted.

In the first step, the gate electrode layer 12 may be formed with a film formation method using a mask that follows the shape of the gate electrode layer 12. Alternatively, the gate electrode layer 12 may be formed by forming an electrode film for forming the gate electrode layer 12 and then processing the electrode film into the shape of the gate electrode layer 12 by etching.

The film forming method used to form the gate electrode layer 12 may be, for example, at least one of vacuum deposition, ion plating, sputtering, laser ablation, spin coating using conductive paste, dip coating, and slit die coating. Alternatively, the film forming method used to form the gate electrode layer 12 may be, for example, at least one of screen printing, relief printing, intaglio printing, planographic printing, and inkjet printing.

In the second step, the first gate insulating coating 21 may be formed by a coating method using a mask that follows the shape of the first gate insulating coating 21. Alternatively, the first gate insulating coating 21 may be formed by forming a coating film for forming the first gate insulating coating 21 and then processing the coating film into the shape of the first gate insulating coating 21 by photolithography.

The coating method used to form the first gate insulating coating 21 may be, for example, at least one of spin coating, dip coating, slit die coating, screen printing, gravure offset printing, and inkjet printing, using a coating solution containing an organic polymer compound, an organic-inorganic composite material, or a precursor of an organic-inorganic composite material. In the coating method, the coating film is formed by baking a liquid film formed by the coating solution. When photolithography is used to form the first gate insulating coating 21, the coating solution contains a photosensitive polymer.

In the third step, the second gate insulating coating 22 may be formed by a coating method using a mask that follows the shape of the second gate insulating coating 22. Alternatively, the second gate insulating coating 22 may be formed by forming an insulating coating for forming the second gate insulating coating 22 and then processing the coating film into the shape of the second gate insulating coating 22 by etching.

The film forming method used to form the second gate insulating coating 22 may be, for example, at least one of laser ablation, plasma CVD, optical CVD, thermal CVD, sputtering, ALD, and sol-gel. Alternatively, the film forming method used to form the second gate insulating coating 22 may be, for example, at least one coating method of spin coating, dip coating, slit die coating, screen printing, and inkjet printing, using a coating solution containing a precursor of an inorganic polymer compound.

In the fourth step, the semiconductor layer 13 may be formed with a film formation method using a mask that follows the shape of the semiconductor layer 13. Alternatively, the semiconductor layer 13 may be formed by forming a semiconductor coating for forming the semiconductor layer 13 and then processing the semiconductor coating into the shape of the semiconductor layer 13 by etching.

The semiconductor layer 13 is formed using sputtering, CVD, ALD, or sol-gel. Sputtering includes DC sputtering in which a DC voltage is applied to the flexible substrate 11, or RF sputtering in which radio waves are applied to the film forming space. The impurities may be, for example, introduced by ion implantation, ion doping, or plasma immersion-ion implantation. Alternatively, the film forming method used to form the semiconductor layer 13 may be, for example, at least one coating method of spin coating, dip coating, slit die coating, screen printing, and inkjet printing, using a coating solution containing a precursor of an inorganic polymer compound.

In the fifth step, the source electrode layer 14 and the drain electrode layer 15 may be formed by a film formation method using a mask that follows the shape of the electrode layer. Alternatively, the source electrode layer 14 and the drain electrode layer 15 may be formed by forming electrode coatings for forming the electrode layers 14 and 15 and then processing the electrode coatings into the shape of the source electrode layer 14 and the drain electrode layer 15 by etching.

The film forming method used to form the source electrode layer 14 and the drain electrode layer 15 is at least one of vacuum deposition, ion plating, sputtering, laser ablation, spin coating using conductive paste, dip coating, and slit die coating. Alternatively, the film forming method used to form the source electrode layer 14 and drain electrode layer 15 may be, for example, at least one of screen printing, relief printing, intaglio printing, planographic printing, and inkjet printing.

EXAMPLES

Example 1-1

In Example 1-1, a bottom-gate top-contact transistor having the structure shown in FIG. 1 was obtained.

First, a polyimide film having a thickness of 20 μm was prepared as the flexible substrate 11. An AlNd film having a thickness of 80 nm was formed as the gate electrode layer 12. After forming the AlNd film at room temperature using a DC magnetron sputtering system, a resist pattern was formed on the AlNd film by photolithography. Then, the resist pattern was removed from the AlNd film by wet-etching the AlNd film to obtain the gate electrode layer 12. The AlNd film forming conditions were as follows.

AlNd Film Forming Conditions

Target composition ratio: Al (at %):Nd (at %)=98:2
Sputtering gas: Argon
Sputtering gas flow rate: 100 sccm
Film formation pressure: 1.0 Pa
Target power: 200 W (DC)
Substrate temperature: Room temperature Subsequently, an acrylic polymer film having a thickness of 1500 nm was formed as the first gate insulating coating 21. In the formation of the acrylic polymer film, first, a coating film was formed by applying an acrylic solution containing an acrylic polymer, which is an organic polymer compound, to the upper surfaces of the flexible substrate 11 and the gate electrode layer 12 using spin coating. Then, the coating film was baked to obtain an acrylic polymer film.

After that, the thickness of the first gate insulating coating 21 was measured using a stylus profiler (Dektak 6M, manufactured by Bruker Japan). In addition, the Young's modulus of the first gate insulating coating 21 was measured using a microhardness tester (TI Premier, manufactured by Bruker Japan). The Young's modulus of the first gate insulating coating 21 was 20 GPa.

The acrylic polymer film was formed using spin coating under the following conditions.

Acrylic Polymer Film Forming Conditions

Substrate rotation speed: 420 rpm/30 sec
Sintering temperature: 220° C.
Sintering time: 1 hour A silicon nitride film having a thickness of 30 nm was formed on the upper surface of the acrylic polymer film using a plasma CVD device. Then, a resist pattern was formed on the silicon nitride film by photolithography, and the resist pattern was removed after dry-etching the silicon nitride film to obtain the second gate insulating coating 22. The thickness of the second gate insulating coating 22 was measured using the same stylus profilometer as above. The Young's modulus of the second gate insulating coating was also measured using the same microhardness tester as above. The Young's modulus of the second gate insulating coating 22 was 300 GPa.

The silicon nitride film was formed using a plasma CVD device under the following conditions.

Silicon Nitride Film Forming Conditions

Reactive gas: Silane/ammonia/hydrogen/nitrogen
Reactive gas flow rate: 10 sccm (silane), 70 sccm (ammonia)
5000 sccm (hydrogen), 2000 sccm (nitrogen)
Film formation pressure: 200 Pa
Radio wave power: 1000 W
Radio wave power frequency: 13.56 MHz
Substrate temperature: 200° C.
Film formation time: 90 sec Subsequently, using a DC magnetron sputtering system, an InGaZnO film having a thickness of 50 nm was formed. Next, a resist pattern was formed on the InGaZnO film using photolithography. Then, the resist pattern was removed by wet-etching the InGaZnO film to obtain the semiconductor layer 13. The thickness of the semiconductor layer 13 was measured using the same stylus profilometer as above. The Young's modulus of the semiconductor layer 13 was also measured using the same microhardness tester as above. The Young's modulus of the semiconductor layer 13 was 150 GPa.

The InGaZnO film was formed using sputtering under the following conditions.

InGaZnO Film Forming Conditions

Target composition ratio: at % In:Ga:Zn:O=1:1:1:4
Sputtering gas: Argon/oxygen
Sputtering gas flow rate: 50 sccm (argon), 0.2 sccm (oxygen)
Film formation pressure: 1.0 Pa
Target power: 450 W Target frequency: 13.56 MHz
Substrate temperature: Room temperature
Film formation time: 25 min Subsequently, a lift-off resist was applied onto the semiconductor layer 13 and the second gate insulating coating 22 using a spin coater. Then, an inverted pattern of the source electrode layer 14 and the drain electrode layer 15 was formed from the lift-off resist using photolithography. Subsequently, using a DC magnetron sputtering system, an AlNd film having a thickness of 80 nm was formed at room temperature. The inverted pattern was removed using the lift-off method to obtain the source electrode layer 14 and the drain electrode layer 15. The thin film transistor of Example 1-1 was thus obtained. The thin film transistor had a channel length of 10 μm and a channel width of 30 μm.

The AlNd film was formed using sputtering under the following conditions.

AlNd Film Forming Conditions

Target composition ratio: Al (at %):Nd (at %)=98:2

Sputtering gas: Argon

Sputtering gas flow rate: 100 sccm

Film formation pressure: 1.0 Pa

Target power: 200 W (DC)

Substrate temperature: Room temperature

Example 1-2

The thin film transistor of Example 1-2 was obtained in the same manner as in Example 1-1 except that the spin coating conditions for forming the first gate insulating coating 21 were changed as follows and the sintering temperature was changed to 200° C. The first gate insulating coating 21 had a thickness of 1500 nm and Young's modulus of 10 GPa.

Acrylic Polymer Film Forming Conditions

Substrate rotation speed: 440 rpm/30 sec

Example 1-3

The thin film transistor of Example 1-2 was obtained in the same manner as in Example 1-1 except that the spin coating conditions for forming the first gate insulating coating 21 were changed as follows. The first gate insulating coating 21 had a thickness of 700 nm and Young's modulus of 20 GPa.

Acrylic Polymer Film Forming Conditions

Substrate rotation speed: 1250 rpm/30 sec

Example 1-4

The thin film transistor of Example 1-4 was obtained in the same manner as in Example 1-1 except that the spin coating conditions for forming the first gate insulating coating 21 were changed as follows and the sintering temperature of the first gate insulating coating 21 was changed to 180° C. The first gate insulating coating 21 had a thickness of 1500 nm and Young's modulus of 3 GPa.

Acrylic Polymer Film Forming Conditions

Substrate rotation speed: 460 rpm/30 sec

Example 1-5

The thin film transistor of Example 1-5 was obtained in the same manner as in Example 1-1 except that the acrylic polymer solution for forming the first gate insulating coating 21 was diluted three folds using propylene glycol monomethyl ether acetate as the dilution solvent, and the spin coating conditions were changed as follows. The first gate insulating coating 21 had a thickness of 100 nm and Young's modulus of 20 GPa.

Acrylic Polymer Film Forming Conditions

Substrate rotation speed: 2800 rpm/30 sec

Example 1-6

The thin film transistor of Example 1-6 was obtained in the same manner as in Example 1-1 except that the second gate insulating coating 22 was formed with an aluminum oxide film formed using an ALD device. The second gate insulating coating 22 had a thickness of 30 nm and Young's modulus of 250 GPa.

The aluminum oxide film was formed using an ALD device under the following conditions.

Aluminum Oxide Film Formation Conditions

Reactive gas: Trimethylaluminum/water vapor

Purge gas: Nitrogen

Film formation pressure: 40 Pa

Number of cycles: 330 times

Substrate temperature: 200° C.

Example 1-7

The thin film transistor of Example 1-7 was obtained in the same manner as in Example 1-1 except that the second gate insulating coating 22 was formed with a silicon oxynitride film formed using a plasma CVD device. The second gate insulating coating 22 had a thickness of 30 nm and Young's modulus of 150 GPa.

The silicon oxynitride film was formed using a plasma CVD device under the following conditions.

Conditions for Silicon Oxynitride Film Formation

Reactive gas: Silane/ammonia/hydrogen/nitrous oxide

Reactive gas flow rate: 50 sccm (silane), 100 sccm (ammonia)

1000 sccm (hydrogen)

500 sccm (dinitrogen monoxide)

Film formation pressure: 300 Pa

Radio wave power: 900 W

Radio wave power frequency: 13.56 MHz

Substrate temperature: 200° C.

Film formation time: 110 sec

Example 1-8

The thin film transistor of Example 1-8 was obtained in the same manner as in Example 1-1 except that the film formation time in the formation of the second gate insulating coating 22 was changed to 30 seconds. The second gate insulating coating 22 had a thickness of 10 nm and Young's modulus of 300 GPa.

Example 1-9

The thin film transistor of Example 1-9 was obtained in the same manner as in Example 1-1 except that the second gate insulating coating 22 was formed with a silicon oxide film formed using a plasma CVD device. The second gate insulating coating 22 had a thickness of 30 nm and Young's modulus of 50 GPa.

The silicon oxide film was formed using a plasma CVD device under the following conditions.

Conditions for Silicon Oxide Film Formation

Reactive gas: Silane/nitrous oxide

Reactive gas flow rate: 65 sccm (silane)

500 sccm (dinitrogen monoxide)

Film formation pressure: 200 Pa
Radio wave power: 500 W
Radio wave power frequency: 13.56 MHz
Substrate temperature: 200° C.
Film formation time: 120 sec Example 1-10

The thin film transistor of Example 1-10 was obtained in the same manner as in Example 1-1 except that the film formation time in the formation of the second gate insulating coating 22 was changed to 6 seconds. The second gate insulating coating 22 had a thickness of 2 nm and Young's modulus of 300 GPa.

Example 1-11

The thin film transistor of Example 1-11 was obtained in the same manner as in Example 1-9 except that the film formation time in the formation of the second gate insulating coating 22 was changed to 8 seconds. The second gate insulating coating 22 had a thickness of 2 nm and Young's modulus of 50 GPa.

Example 1-12

The thin film transistor of Example 1-12 was obtained in the same manner as in Example 1-1 except that the target power in the formation of the semiconductor layer 13 was changed to 350 W and the film formation time was changed to 35 minutes. The second gate insulating coating 22 had a thickness of 30 nm and Young's modulus of 300 GPa. The semiconductor layer 13 had a thickness of 50 nm and Young's modulus of 120 GPa.

Example 1-13

The thin film transistor of Example 1-13 was obtained in the same manner as in Example 1-1 except that the target power in the formation of the semiconductor layer 13 was changed to 250 W and the film formation time was changed to 50 minutes. The semiconductor layer 13 had a thickness of 50 nm and Young's modulus of 100 GPa.

Example 1-14

The thin film transistor of Example 1-14 was obtained in the same manner as in Example 1-1 except that the film formation time in the formation of the semiconductor layer 13 was changed to 15 minutes. The semiconductor layer 13 had a thickness of 30 nm and Young's modulus of 150 GPa.

Example 1-15

The thin film transistor of Example 1-15 was obtained in the same manner as in Example 1-1 except that the film formation time in the formation of the semiconductor layer 13 was changed to 7.5 minutes. The semiconductor layer 13 had a thickness of 15 nm and Young's modulus of 150 GPa.

Example 1-16

The thin film transistor of Example 1-16 was obtained in the same manner as in Example 1-1 except that the film formation time in the formation of the semiconductor layer 13 was changed to 15 minutes and the target power was changed to 250 W. The semiconductor layer 13 had a thickness of 15 nm and Young's modulus of 100 GPa.

Example 1-17

The thin film transistor of Example 1-17 was obtained in the same manner as in Example 1-1 except that the target power in the formation of the semiconductor layer 13 was changed to 500 W and the film formation time was changed to 23 minutes. The semiconductor layer 13 had a thickness of 50 nm and Young's modulus of 160 GPa.

Example 1-18

The thin film transistor of Example 1-18 was obtained in the same manner as in Example 1-1 except that the film formation time in the formation of the semiconductor layer 13 was changed to 30 minutes. The semiconductor layer 13 had a thickness of 60 nm and Young's modulus of 150 GPa.

Example 1-19

The thin film transistor of Example 1-19 was obtained in the same manner as in Example 1-1 except that the film formation time in the formation of the semiconductor layer 13 was changed to 17 minutes and the target power was changed to 200 W. The semiconductor layer 13 had a thickness of 15 nm and Young's modulus of 90 GPa.

Example 1-20

The thin film transistor of Example 1-20 was obtained in the same manner as in Example 1-1 except that the film formation time in the formation of the semiconductor layer 13 was changed to 9 minutes and the target power was changed to 400 W. The semiconductor layer 13 had a thickness of 10 nm and Young's modulus of 140 GPa.

Comparative Example 1-1

The thin film transistor of Comparative Example 1-1 was obtained in the same manner as in Example 1-1 except that the acrylic polymer solution for forming the first gate insulating coating 21 was diluted three folds using propylene glycol monomethyl ether acetate as the dilution solvent, and the spin coating conditions were changed as follows in the formation of the first gate insulating coating 21. The first gate insulating coating 21 had a thickness of 90 nm and Young's modulus of 20 GPa.

Acrylic Polymer Film Forming Conditions
Substrate rotation speed: 3300 rpm/30 sec Comparative Example 1-2

The thin film transistor of Comparative Example 1-2 was obtained in the same manner as in Example 1-1 except that the spin coating conditions for forming the first gate insulating coating 21 were changed as follows. The first gate insulating coating 21 had a thickness of 1600 nm and Young's modulus of 20 GPa.

Acrylic Polymer Film Forming Conditions
Substrate rotation speed: 380 rpm/30 sec Comparative Example 1-3

The thin film transistor of Comparative Example 1-3 was obtained in the same manner as in Example 1 except that the acrylic polymer solution for forming the first gate insulating coating 21 was diluted three folds using propylene glycol monomethyl ether acetate as the dilution solvent, the spin coating conditions were changed as follows in the formation of the first gate insulating coating 21, and the sintering temperature was changed to 180° C. The first gate insulating coating 21 had a thickness of 100 nm and Young's modulus of 2 GPa.

Acrylic Polymer Film Forming Conditions

Substrate rotation speed: 2840 rpm/30 sec

Comparative Example 1-4

The thin film transistor of Comparative Example 1-4 was obtained in the same manner as in Example 1-1 except that the spin coating conditions for forming the first gate insulating coating 21 were changed as follows and the sintering temperature was changed to 230° C. The first gate insulating coating 21 had a thickness of 1100 nm and Young's modulus of 30 GPa.

Acrylic Polymer Film Forming Conditions

Substrate rotation speed: 630 rpm/30 sec

Comparative Example 1-5

The thin film transistor of Comparative Example 1-5 was obtained in the same manner as in Example 1-9 except that the film formation time in the formation of the second gate insulating coating 22 was changed to 3 seconds and the radio wave power was changed to 1000 W. The second gate insulating coating 22 had a thickness of 1 nm and Young's modulus of 90 GPa.

Comparative Example 1-6

The thin film transistor of Comparative Example 1-6 was obtained in the same manner as in Example 1-1 except that the film formation time in the formation of the second gate insulating coating 22 was changed to 120 seconds. The second gate insulating coating 22 had a thickness of 40 nm and Young's modulus of 300 GPa.

Comparative Example 1-7

The thin film transistor of Comparative Example 1-7 was obtained in the same manner as in Example 1-9 except that the film formation time in the formation of the second gate insulating coating 22 was changed to 10 seconds and the radio wave power was changed to 450 W. The second gate insulating coating 22 had a thickness of 2 nm and Young's modulus of 40 GPa.

Comparative Example 1-8

The thin film transistor of Comparative Example 1-8 was obtained in the same manner as in Example 1-1 except that the film formation time in the formation of the second gate insulating coating 22 was changed to 85 seconds and the radio wave power was changed to 1200 W. The 10 second gate insulating coating 22 had a thickness of 30 nm and Young's modulus of 320 GPa.

Evaluation Method

The transfer characteristics of the thin film transistors of Examples 1-1 to 1-20 and Comparative Examples 1-1 to 1-8 were measured using a semiconductor parameter analyzer (B1500A, manufactured by Agilent Technologies). Further, the mobility and on/off ratio was calculated. The least significant digit of the mobility was set to the first decimal place, and the least significant digit of the on/off ratio was set to the ones place.

In the bending test performed to calculate the rate of decrease in mobility and the on/off ratio difference, each thin film transistor was wrapped around a metal bar with a diameter of 1 mm. Then, the ratio of the difference between the mobility before the bending test and the mobility after the bending test to the mobility before the bending test was calculated as the rate of decrease in mobility. The difference between the on/off ratio before the bending test and the on/off ratio after the bending test was also calculated.

Evaluation Results

With reference to FIGS. 3 and 4, the evaluation results will be described below. FIG. 3 shows the thickness T1 (nm) and Young's modulus E1 (GPa) of the first gate insulating coating 21, and the product T1E1 (nm·GPa) of the thickness T1 and Young's modulus E1 for each of the thin film transistors of Examples 1-1 to 1-20. FIG. 3 shows the thickness T2 (nm) and Young's modulus E2 (GPa) of the second gate insulating coating 22, and the product T2E2 (nm·GPa) of the thickness T2 and Young's modulus E2 for each of the thin film transistors of Examples 1-1 to 1-20. FIG. 3 further shows the thickness T3 (nm) and Young's modulus E3 (GPa) of the semiconductor layer 13, and the product T3E3 of the thickness T3 and Young's modulus E3 for each of the thin film transistors of Examples 1-1 to 1-20. FIG. 3 also shows the mobility, the mobility decrease rate, the number of digits of the on/off ratio before the bending test, and the number of digits of the on/off ratio difference for each of the thin film transistors of Examples 1-1 to 1-20.

On the other hand, FIG. 4 shows the thickness T1 (nm) and Young's modulus E1 (GPa) of the first gate insulating coating 21, and the product T1E1 (nm·GPa) of the thickness T1 and Young's modulus E1 for each of the thin film transistors of Comparative Examples 1-1 to 1-8. FIG. 4 shows the thickness T2 (nm) and Young's modulus E2 (GPa) of the second gate insulating coating 22, and the product T2E2 (nm·GPa) of the thickness T2 and Young's modulus E2 for each of the thin film transistors of Comparative Examples 1-1 to 1-8. FIG. 4 further shows the thickness T3 (nm) and Young's modulus E3 (GPa) of the semiconductor layer 13, and the product T3E3 of the thickness T3 and Young's modulus E3 for each of the thin film transistors of Comparative Examples 1-1 to 1-8. FIG. 4 also shows the mobility, the mobility decrease rate, the number of digits of the on/off ratio before the bending test, and the number of digits of the on/off ratio difference for each of the thin film transistors of Comparative Examples 1-1 to 1-8.

As shown in FIGS. 3 and 4, before the bending test, the mobilities of the thin film transistors of Examples 1-1 to 1-20 and the mobilities of the thin film transistors of Comparative Examples 1-1 to 1-8 were as high as 10.0 $cm^2/Vs$ or higher. The mobility decrease rates of the thin film transistors of Comparative Examples 1-2 and 1-4 to 1-8 were 50% or higher. As for the thin film transistors of Comparative Examples 1-1 and 1-3, the mobility decrease rate could not be measured since the thin film transistors were not operable after the bending test.

On the other hand, the mobility decrease rates of the thin film transistors of Examples 1-17 to 1-20 were as low as 13.0% or lower. The mobility decrease rates of the thin film transistors of Examples 1-1 to 1-16 were even lower and had a value of 2.8% or lower.

First, by comparing the thin film transistors of Examples 1-1 to 1-20 and the thin film transistors of Comparative Examples 1-1 to 1-4, it can be seen that the mobility decrease rate can be decreased when the thickness of the first gate insulating coating 21 is within the range of 100 nm or greater and 1500 nm or less, and the product of the thickness and Young's modulus of the first gate insulating coating 21 is within the range of 2000 nm·GPa or greater and 30000 nm·GPa or less.

On the other hand, regarding the thin film transistor of Comparative Example 1-1, it is considered that the thickness of the first gate insulating coating 21 was so small that the plasma damage during formation of the second gate insulating coating 22 deteriorated the film quality significantly, and therefore the insulation of the first gate insulating coating 21 decreased when the thin film transistor was bent. As for the thin film transistor of Comparative Example 1-3, it is considered that the Young's modulus of the first gate insulating coating 21 was so low that the plasma damage during formation of the second gate insulating coating 22 deteriorated the film quality significantly, and therefore the insulation of the first gate insulating coating 21 decreased when the thin film transistor was bent.

As for the thin film transistor of Comparative Example 1-2, it is considered that the large thickness of the first gate insulating coating 21 increased the strain energy generated in the first gate insulating coating 21 when the thin film transistor was bent, which makes the first gate insulating coating 21 and the second gate insulating coating 22 more prone to cracking when the thin film transistor is bent. In addition, it is considered that the adhesion at the interface between the first gate insulating coating 21 and the second gate insulating coating 22 of the thin film transistor of Comparative Example 1-2 decreased. With regard to the thin film transistor of Comparative Example 1-4, it is considered that the high Young's modulus of the first gate insulating coating 21 made the first gate insulating coating 21 less deformable, which makes the first gate insulating coating 21 and the second gate insulating coating 22 more prone to cracking when the thin film transistor is bent. In addition, it is considered that the adhesion at the interface between the first gate insulating coating 21 and the second gate insulating coating 22 of the thin film transistor of Comparative Example 1-4 decreased.

By comparing the thin film transistors of Examples 1-1 to 1-20 and the thin film transistors of Comparative Examples 1-5 to 1-8, it can be seen that the mobility decrease rate can be reduced when the thickness of the second gate insulating coating 22 is within the range of 2 nm or greater and 30 nm or less, and the product of the thickness and Young's modulus of the second gate insulating coating 22 is within the range of 100 nm·GPa or greater and 9000 nm·GPa or less.

On the other hand, with regard to the thin film transistor of Comparative Example 1-5, it can be considered that the thickness of the second gate insulating coating 22 was so small that the film quality of the second gate insulating coating 22 deteriorated and the state of the interface between the second gate insulating coating 22 and the semiconductor layer 13 became unstable. This may be the reason the thin film transistor of Comparative Example 1-5 had a high mobility decrease rate when the thin film transistor was bent. With regard to the thin film transistor of Comparative Example 1-7, it can be considered that the Young's modulus was so small that the film quality of the second gate insulating coating 22 deteriorated, and the state of the interface between the second gate insulating coating 22 and the semiconductor layer 13 became unstable. This may be the reason the thin film transistor of Comparative Example 1-7 had a high mobility decrease rate when the thin film transistor was bent.

As for the thin film transistor of Comparative Example 1-6, it is considered that the large thickness of the second gate insulating coating 22 increased the strain energy generated in the second gate insulating coating 22 when the thin film transistor was bent, which makes the second gate insulating coating 22 more prone to cracking when the thin film transistor is bent. In addition, it is considered that the adhesion at the interface between the second gate insulating coating 22 and the first gate insulating coating 21 as well as the adhesion at the interface between the second gate insulating coating 22 and the semiconductor layer 13 decreased in the thin film transistor of Comparative Example 1-6. With regard to the thin film transistor of Comparative Example 1-8, it is considered that the high Young's modulus of the second gate insulating coating 22 made the second gate insulating coating 22 less deformable, which makes the second gate insulating coating 22 more prone to cracking when the thin film transistor is bent. In addition, it is considered that the adhesion at the interface between the second gate insulating coating 22 and the first gate insulating coating 21 as well as the adhesion at the interface between the second gate insulating coating 22 and the semiconductor layer 13 decreased in the thin film transistor of Comparative Example 1-8.

In contrast to these thin film transistors of Comparative Examples 1-1 to 1-8, according to the thin film transistors of Examples 1-1 to 1-20, it can be considered that the mobility decrease rate was able to be reduced since the decrease in film quality, cracking, and deterioration in adhesion were suppressed in both the first gate insulating coating 21 and the second gate insulating coating 22.

Next, by comparing the thin film transistors of Examples 1-1 to 1-16 and the thin film transistors of Examples 1-17 to 1-20, it can be seen that the mobility decrease rate can be further reduced when the thickness of the semiconductor layer 13 is within the range of 15 nm or greater and 50 nm or less, and the product of the thickness and Young's modulus is within the range of 1500 nm·GPa or greater and 7500 nm·GPa or less.

On the other hand, with regard to the thin film transistor of Example 1-17, it is considered that the high Young's modulus of the semiconductor layer 13 made the semiconductor layer 13 less deformable, which makes the semiconductor layer 13 more prone to cracking when the thin film transistor is bent. In addition, it is considered that the adhesion at the interface between the second gate insulating coating 22 and the semiconductor layer 13 of the thin film transistor of Example 1-17 is likely to decrease. As for the thin film transistor of Example 1-18, it is considered that the large thickness of the semiconductor layer 13 increased the strain energy generated in the semiconductor layer 13 when the thin film transistor was bent, which makes the semiconductor layer 13 more prone to cracking when the thin film transistor is bent. In addition, it is considered that the adhesion at the interface between the second gate insulating coating 22 and the semiconductor layer 13 of the thin film transistor of Example 1-17 is likely to decrease.

With regard to the thin film transistor of Example 1-19, it can be considered that the Young's modulus was so small that the film quality of the semiconductor layer 13 was likely to deteriorate, and the state of the interface between the second gate insulating coating 22 and the semiconductor layer 13 became unstable. Therefore, the thin film transistor of Example 1-19 may tend to have a high mobility decrease rate when the thin film transistor is bent. With regard to the thin film transistor of Example 1-20, it can be considered that the thickness of the semiconductor layer 13 was so small that the film quality of the semiconductor layer 13 was likely to deteriorate, and the state of the interface between the second gate insulating coating 22 and the semiconductor layer 13 became unstable. Therefore, the thin film transistor of Example 1-20 may tend to have a high mobility decrease rate when the thin film transistor is bent.

In contrast to these thin film transistors of Examples 1-17 to 1-20, according to the thin film transistors of Examples 1-1 to 1-16, it can be considered that the mobility decrease rate was able to be further reduced since the decrease in film quality, cracking, and deterioration in adhesion were suppressed in the semiconductor layer 13.

The number of digits of the on/off ratio before the bending test was nine for the thin film transistors of Examples 1-1 to 1-20 and Comparative Examples 1-1 to 1-8. The number of digits of the on/off ratio difference was zero for the thin film transistors of Examples 1-1 to 1-20.

On the other hand, the number of digits of the on/off ratio difference was five for the thin film transistor of Comparative Examples 1-2, and the number of digits of the on/off ratio difference was six for the thin film transistors of Comparative Examples 1-4, 1-6, and 1-8. The number of digits of the on/off ratio difference was two for the thin film transistors of Comparative Examples 1-5 and 1-7.

Based on these results, it can be considered that, since the first gate insulating coating 21 and the second gate insulating coating 22 are prone to cracking, and the adhesion at the interface between the first gate insulating coating 21 and the second gate insulating coating 22 decreases in Comparative Examples 1-2 and 1-4 as described above, the on-current decreases, and as a result, the on/off ratio difference increases.

As for the thin film transistors of Comparative Examples 1-6 and 1-8, it can be considered that, due to the cracking of the second gate insulating coating 22, and the resulting reduced adhesion at the interface between the first gate insulating coating 21 and the second gate insulating coating 22 and the interface between the second gate insulating coating 22 and the semiconductor layer 13, the on-current decreases, and as a result, the on/off ratio difference increases. As for Comparative Examples 1-5 and 1-7, it can be considered that, since the state of the interface between the second gate insulating coating 22 and the semiconductor layer 13 is unstable, the on current decreases, and as a result, the on/off ratio difference increases.

On the other hand, according to the thin film transistors of Examples 1-1 to 1-20, as described above, since it is possible to prevent the first gate insulating coating 21 and the second gate insulating coating 22 from cracking, it is possible to prevent the on-current from decreasing after the bending test, and as a result, increase in the on/off ratio difference can be suppressed.

As described above, according to the first embodiment of the thin film transistor and the method of manufacturing a thin film transistor, it is possible to obtain the following effects.

1-1: With a structure that satisfies Conditions 1 and 2 described above, even when the thin film transistor is bent, the first gate insulating coating 21 and the second gate insulating coating 22 themselves do not deteriorate, and also the state of the interface between the first gate insulating coating 21 and the second gate insulating coating 22 does not deteriorate. This reduces the decrease in mobility caused by the thin film transistor being bent. As a result, it is possible to improve the electrical durability of the thin film transistor against bending of the flexible substrate 11.

1-2: With a structure that satisfies Condition 3 described above, it is possible to prevent the semiconductor layer 13 itself from deteriorating and the state of the interface between the semiconductor layer 13 and the second gate insulating coating 22 deteriorating when the thin film transistor is bent. This further reduces the decrease in mobility due to bending of the thin film transistor. As a result, it is possible to further improve the electrical durability of the thin film transistor against bending of the flexible substrate 11.

Second Embodiment

A second embodiment of a thin film transistor and an embodiment of a method of manufacturing a thin film transistor will be described below with reference to FIGS. 5 to 11. The thin film transistor of the second embodiment differs from the thin film transistor of the first embodiment in that it includes a protective layer. The second embodiment will be described focusing on the differences between the first and second embodiments, omitting specific explanation of the components common to the first embodiment by designating the same reference signs thereto as those of the first embodiment.

Note that FIG. 5 shows a third example of a multilayer structure of a thin film transistor, and FIG. 6 shows a fourth example of a multilayer structure of a thin film transistor. In the following, the upper and lower surfaces of each component of the thin film transistor will be described assuming it is oriented as in FIGS. 5 and 6.

In addition, since the source and the drain in the thin film transistor are determined according to the operation of the driver circuit of the thin film transistor, a first electrode layer may change its function from source to drain, and a second electrode layer may change its function from drain to source.

Multilayer Structure

As shown in FIG. 5, the third example of a thin film transistor is a bottom-gate top-contact transistor. The differences of the bottom-gate top-contact transistor structure from the bottom-gate top-contact transistor structure described above, that is, the first example of a thin film transistor will be mainly described below.

The third example of a thin film transistor has a protective layer 31. The protective layer 31 is an insulating layer. The protective layer 31 is sandwiched between the semiconductor layer 13, and the source electrode layer 14 and the drain electrode layer 15. The protective layer 31 covers the semiconductor layer 13 and part of the second gate insulating coating 22. The protective layer 31 has a first through hole 31H1 and a second through hole 31H2. The through-holes 31H1 and 31H2 penetrate the protective layer 31 in the thickness direction of the protective layer 31, that is, in the channel depth direction Z.

An upper surface 13S of the semiconductor layer 13 includes a first region 13S1 and a second region 13S2. The first region 13S1 is exposed to the first through hole 31H1 of the protective layer 31. The second region 13S2 is exposed to the second through hole 31H2 of the protective layer 31. In other words, the protective layer 31 covers the semiconductor layer 13 in such a manner that the first and second regions 13S1 and 13S2 on the upper surface 13S of the semiconductor layer 13 are exposed through the protective layer 31.

The source electrode layer 14 includes a part located on the protective layer 31 and a part filled in the first through hole 31H1. The part of the source electrode layer 14 filled in the first through hole 31H1 is in contact with the first region 13S1 of the semiconductor layer 13. The drain electrode layer 15 includes a part located on the protective layer 31 and a part filled in the second through hole 31H2. The part of the drain electrode layer 15 filled in the second through hole 31H2 is in contact with the second region 13S2 of the semiconductor layer 13.

In the third example of the thin film transistor, the region of the semiconductor layer 13 between the first and second through holes 31H1 and 31H2 is the channel region C.

As shown in FIG. 6, the fourth example of a thin film transistor is a bottom-gate top-contact transistor. The differences of the bottom-gate top-contact transistor structure from the bottom-gate top-contact transistor structure described above, that is, the first example of a thin film transistor will be mainly described below.

The fourth example of a thin film transistor has a protective layer 31. The protective layer 31 covers part of the semiconductor layer 13. The upper surface 13S of the semiconductor layer 13 has a region exposed through the semiconductor layer 13 at each end thereof in the channel length direction X. One of the regions exposed from the upper surface 13S of the semiconductor layer 13 is the first region 13S1, and the other is the second region 13S2. In other words, the protective layer 31 covers the semiconductor layer 13 in such a manner that the first and second regions 13S1 and 13S2 on the upper surface 13S of the semiconductor layer 13 are exposed through the protective layer 31.

The source electrode layer 14 covers part of the protective layer 31, the first region 13S1 of the semiconductor layer 13, and part of the second gate insulating coating 22. The source electrode layer 14 is in contact with the first region 13S1. The drain electrode layer 15 covers part of the protective layer 31, the second region 13S2 of the semiconductor layer 13, and part of the second gate insulating coating 22. The drain electrode layer 15 is in contact with the second region 13S2.

In the fourth example of the thin film transistor, the region of the semiconductor layer 13 covered by the protective layer 31 is the channel region C.

Protective Layer

The protective layer 31 according to an embodiment of the present invention has a function of protecting the semiconductor layer 13 in the steps of the manufacturing process of the thin film transistor after forming the protective layer 31. In the manufacturing process of the thin film transistor, the source electrode layer 14 and the drain electrode layer 15 are formed after forming the semiconductor layer 13. The source electrode layer 14 and the drain electrode layer are formed, for example, by forming metal films for forming the electrode layers 14 and 15 and then etching them.

Wet etching or dry etching is used to etch the metal films. In wet etching, an etching solution is used as an etchant for the metal films. On the other hand, in dry etching, an etching gas is used as an etchant for the metal films. The semiconductor layer 13 may deteriorate as a result of these etchants reacting with the semiconductor layer 13.

Since the semiconductor layer 13 is covered with the protective layer 31 in the step of etching the metal films, the semiconductor layer 13 is prevented from coming into contact with the etchant. This prevents deterioration of the semiconductor layer 13.

On the other hand, the protective layer 31 has a function of protecting the semiconductor layer 13 from the atmosphere in which the thin film transistor is placed after the thin film transistor is manufactured. Since the semiconductor layer 13 is covered with the protective layer 31 in the thin film transistor, for example, the semiconductor layer 13 is prevented from coming into contact with moisture in the atmosphere. This prevents deterioration of the semiconductor layer 13.

The material forming the protective layer 31 may be an organic polymer compound or an organic-inorganic composite material. The organic polymer compound may be at least one selected from polyvinylphenol, polyimide, polyvinyl alcohol, acrylic polymers, epoxy polymers, fluoropolymers including amorphous fluoropolymers, melamine polymers, furan polymers, xylene polymers, polyamideimide polymers, silicone polymers, and cycloolefin polymers.

The organic-inorganic composite material may be, for example, a mixture of particles of an organic polymeric compound and inorganic compound. Note that particles of an inorganic compound are nanoparticles, that is, particles having a size within the range of several nanometers to several hundreds of nanometers.

Alternatively, the organic-inorganic composite material may have a molecular structure including an atomic group having the properties of an organic compound and an atomic group having the properties of an inorganic compound. An example of such an organic-inorganic composite material is a silsesquioxane. The molecular structure of silsesquioxanes has a skeleton formed of silicon and oxygen that is an atomic group having the property of an inorganic compound, and an organic group as an atomic group having the property of an organic compound.

The protective layer 31 may be a single-layer coating or a multilayer coating. When the protective layer 31 is a multilayer coating, the material of each of the layers constituting the protective layer 31 is an organic polymer compound or an organic-inorganic composite material.

In order to prevent deterioration of the semiconductor layer 13 due to patterning of the source electrode layer 14 and the drain electrode layer 15 using etching, the thickness of the protective layer 31 is preferably 40 nm or greater. The protective layer 31 also preferably has a thickness of 40 nm or greater in order to prevent deterioration of the semiconductor layer 13 due to the atmosphere in which the thin film transistor is placed.

In order to establish good contact between the source electrode layer 14 and the drain electrode layer 15, and the semiconductor layer 13, the thickness of the protective layer 31 is preferably 1000 nm or less. In particular, as shown in FIG. 5, when the source electrode layer 14 and the drain electrode layer 15 are electrically connected to the semiconductor layer 13 via the through holes 31H1 and 31H2 of the protective layer 31, the surface defining the through holes 31H1 and 31H2 may not be flat if the protective layer 31 is too thick. This may lead to poor conduction between the electrode layers 14 and 15 and the semiconductor layer 13.

In order to improve the effectiveness of obtaining these effects, improve the uniformity of the thickness of the protective layer 31, and reduce the cost required for forming the protective layer 31, the thickness of the protective layer 31 is particularly preferably within the range of 50 nm or greater and 500 nm or less.

In order to secure sufficient insulation between the source electrode layer 14 and the drain electrode layer 15, the resistivity of the protective layer 31 is preferably $1\times10^{11}$ Ω·cm or higher, more preferably $1\times10^{13}$ Ω·cm or higher.

The Young's modulus of the protective layer 31 is 3 GPa or greater and 20 GPa or less. When the Young's modulus of the protective layer 31 is 3 GPa or greater, deterioration of the film quality of the protective layer 31 is suppressed.

When the Young's modulus of the protective layer 31 is 20 GPa or less, deterioration of the bendability of the protective layer 31 is suppressed. The Young's modulus of the protective layer 31 is a value measured by a method conforming to ISO14577.

The protective layer 31 preferably satisfies the following Condition 4.

Condition 4: The thickness is within the range of 40 nm or greater and 1000 nm or less, and the product of the thickness and Young's modulus is within the range of 120 nm·GPa or greater and 20000 nm·GPa or less.

When the protective layer 31 satisfies Condition 4, deterioration of the film quality and deterioration of bendability of the protective layer 31 are suppressed. This prevents the interface between the semiconductor layer 13 and the protective layer 31 from becoming unstable. As a result, the formation of a leak path between the source electrode layer 14 and the drain electrode layer 15 can be prevented. Since the leakage current between the source electrode layer 14 and the drain electrode layer 15 caused when the thin film transistor is bent is suppressed, the off current of the thin film transistor can be kept low even when the thin film transistor is bent. This makes it possible to reduce the difference between the on/off ratio of the thin film transistor before being bent and the on/off ratio of the thin film transistor after being bent. As a result, it is possible to further improve the electrical durability of the thin film transistor against bending of the flexible substrate 11.

The protective layer 31 may be made of silicon oxide, silicon nitride, or silicon oxynitride. In these cases, the Young's modulus of the protective layer 31 falls within the range of 50 GPa or greater and 150 GPa or less. When the Young's modulus of the protective layer 31 is 50 GPa or greater, deterioration of the film quality of the protective layer 31 is suppressed. When the Young's modulus of the protective layer 31 is 150 GPa or less, deterioration of the bendability of the protective layer 31 is suppressed. The Young's modulus of the protective layer 31 is a value measured by a method conforming to ISO14577.

The protective layer 31 satisfies the following Condition 5.

Condition 5: The thickness is within the range of 40 nm or greater and 60 nm or less, and the product of the thickness and Young's modulus is within the range of 2000 nm·GPa or greater and 9000 nm·GPa or less.

When the protective layer 31 satisfies Condition 5, deterioration of the film quality and deterioration of bendability of the protective layer 31 are suppressed. This prevents the protective layer 31 from cracking, which in turn prevents the semiconductor layer 13 covered with the protective layer 31 from cracking. This reduces the decrease in mobility caused by the thin film transistor being bent.

Further, since deterioration of the film quality and deterioration of bendability of the protective layer 31 are suppressed, the interface between the semiconductor layer 13 and the protective layer 31 does not become unstable. As a result, the formation of a leak path between the source electrode layer 14 and the drain electrode layer 15 can be prevented. Since the leakage current between the source electrode layer 14 and the drain electrode layer 15 caused when the thin film transistor is bent is suppressed, the off current of the thin film transistor can be kept low even when the thin film transistor is bent. This makes it possible to reduce the difference between the on/off ratio of the thin film transistor before being bent and the on/off ratio of the thin film transistor after being bent. As a result, it is possible to further improve the electrical durability of the thin film transistor against bending of the flexible substrate 11.

Method of Manufacturing Thin Film Transistor

An example of a method of manufacturing a bottom-gate top-contact transistor having the protective layer 31 will be described. A method of manufacturing a bottom-gate top-contact transistor includes a first step of forming the gate electrode layer 12 on the flexible substrate 11, a second step of laminating the first gate insulating coating 21 on the gate electrode layer 12, and a third step of laminating the second gate insulating coating 22 on the first gate insulating coating 21. The method of manufacturing a bottom-gate top-contact transistor also includes a fourth step of laminating the semiconductor layer 13 on the second gate insulating coating 22, a fifth step of laminating the protective layer 31 on the semiconductor layer 13, and a sixth step of laminating the source electrode layer 14 and the drain electrode layer 15 after forming the protective layer 31.

In the first step, the gate electrode layer 12 may be formed with a film formation method using a mask that follows the shape of the gate electrode layer 12. Alternatively, the gate electrode layer 12 may be formed by forming an electrode film for forming the gate electrode layer 12 and then processing the electrode film into the shape of the gate electrode layer 12 by etching.

The film forming method used to form the gate electrode layer 12 may be, for example, at least one of vacuum deposition, ion plating, sputtering, laser ablation, spin coating using conductive paste, dip coating, and slit die coating. Alternatively, the film forming method used to form the gate electrode layer 12 may be, for example, at least one of screen printing, relief printing, intaglio printing, planographic printing, and inkjet printing.

In the second step, the first gate insulating coating 21 may be formed by a coating method using a mask that follows the shape of the first gate insulating coating 21. Alternatively, the first gate insulating coating 21 may be formed by forming a coating film for forming the first gate insulating coating 21 and then processing the coating film into the shape of the first gate insulating coating 21 by photolithography.

The coating method used to form the first gate insulating coating 21 may be, for example, at least one of spin coating, dip coating, slit die coating, screen printing, gravure offset printing, and inkjet printing, using a coating solution containing an organic polymer compound or an organic-inorganic composite material. In the coating method, the coating film is formed by baking a liquid film formed by the coating solution. When photolithography is used to form the first gate insulating coating 21, the coating solution contains a photosensitive polymer.

In the third step, the second gate insulating coating 22 may be formed by a coating method using a mask that follows the shape of the second gate insulating coating 22. Alternatively, the second gate insulating coating 22 may be formed by forming an insulating coating for forming the second gate insulating coating 22 and then processing the coating film into the shape of the second gate insulating coating 22 by etching.

The film forming method used to form the second gate insulating coating 22 may be, for example, at least one of laser ablation, plasma CVD, optical CVD, thermal CVD, sputtering, ALD, and sol-gel. Alternatively, the film forming method used to form the second gate insulating coating 22 may be, for example, spin coating, dip coating, slit die coating, screen printing, or inkjet printing, using a coating solution containing a precursor of an inorganic polymer compound.

In the fourth step, the semiconductor layer 13 may be formed with a film formation method using a mask that follows the shape of the semiconductor layer 13. Alternatively, the semiconductor layer 13 may be formed by forming a semiconductor coating for forming the semiconductor layer 13 and then processing the semiconductor coating into the shape of the semiconductor layer 13 by etching.

The semiconductor layer 13 is formed using sputtering, CVD, ALD, or sol-gel. Sputtering includes DC sputtering in which a DC voltage is applied to the flexible substrate 11, or RF sputtering in which radio waves are applied to the film forming space. The impurities may be, for example, introduced by ion implantation, ion doping, or plasma immersion-ion implantation. Alternatively, the film forming method used to form the semiconductor layer 13 may be, for example, spin coating, dip coating, slit die coating, screen printing, or inkjet printing, using a coating solution containing a precursor of an inorganic polymer compound.

In the fifth step, the protective layer 31 may be formed with a coating method that uses a mask that conforms with the shape of the protective layer 31. Alternatively, the protective layer 31 may be formed by forming a coating film for forming the protective layer 31 and then processing the coating film into the shape of the protective layer 31 by photolithography.

The coating method used to form the protective layer 31 may be, for example, at least one of spin coating, dip coating, slit die coating, screen printing, and inkjet printing, using a coating solution containing an organic polymer compound or an organic-inorganic composite material. In the coating method, the coating film is formed by baking a liquid film formed by the coating solution. When photolithography is used to form the protective layer 31, the coating solution contains a photosensitive polymer.

In the fifth step, the first and second regions 13S1 and 13S2 exposed through the protective layer 31 are formed on the upper surface 13S of the semiconductor layer 13. The first region 13S1 is a region connected to the source electrode layer 14. The second region 13S2 is a region connected to the drain electrode layer 15.

In the sixth step, the source electrode layer 14 and the drain electrode layer 15 may be formed by a film formation method using a mask that follows the shape of the electrode layer. Alternatively, the source electrode layer 14 and the drain electrode layer 15 may be formed by forming electrode coatings for forming the electrode layers 14 and 15 and then processing the electrode coatings into the shape of the source electrode layer 14 and the drain electrode layer 15 by etching.

The film forming method used to form the source electrode layer 14 and the drain electrode layer 15 may be, for example, at least one of vacuum deposition, ion plating, sputtering, laser ablation, spin coating using conductive paste, dip coating, and slit die coating. Alternatively, the film forming method used to form the source electrode layer 14 and drain electrode layer 15 may be, for example, screen printing, relief printing, intaglio printing, planographic printing, or inkjet printing.

EXAMPLES

Example 2-1

In Example 2-1, a bottom-gate top-contact transistor having the structure shown in FIG. 5 was obtained.

First, a polyimide film having a thickness of 20 μm was prepared as the flexible substrate 11. An AlNd film having a thickness of 80 nm was formed as the gate electrode layer 12. After forming the AlNd film at room temperature using a DC magnetron sputtering system, a resist pattern was formed on the AlNd film by photolithography. Then, the resist pattern was removed from the AlNd film by wet-etching the AlNd film to obtain the gate electrode layer 12. The AlNd film forming conditions were as follows.

AlNd Film Forming Conditions

Target composition ratio: Al (at %):Nd (at %)=98:2
Sputtering gas: Argon
Sputtering gas flow rate: 100 sccm
Film formation pressure: 1.0 Pa
Target power: 200 W (DC)
Substrate temperature: Room temperature Subsequently, an acrylic polymer film having a thickness of 1500 nm was formed as the first gate insulating coating 21. In the formation of the acrylic polymer film, first, a coating film was formed by applying an acrylic solution containing an acrylic polymer, which is an organic polymer compound, to the upper surfaces of the flexible substrate 11 and the gate electrode layer 12 using spin coating. Then, the coating film was baked to obtain an acrylic polymer film as the first gate insulating coating 21.

After that, the thickness of the first gate insulating coating 21 was measured using a stylus profiler (Dektak 6M, manufactured by Bruker Japan). In addition, the Young's modulus of the first gate insulating coating 21 was measured using a microhardness tester (TI Premier, manufactured by Bruker Japan). The Young's modulus of the first gate insulating coating 21 was 20 GPa.

The acrylic polymer film was formed using spin coating under the following conditions.

Acrylic Polymer Film Forming Conditions

Substrate rotation speed: 420 rpm/30 sec
Sintering temperature: 220° C.
Sintering time: 1 hour A silicon nitride film having a thickness of 30 nm was formed on the upper surface of the acrylic polymer film using a plasma CVD device. Then, a resist pattern was formed on the silicon nitride film by photolithography, and the resist pattern was removed after dry-etching the silicon nitride film to obtain the second gate insulating coating 22. The thickness of the second gate insulating coating 22 was measured using the same stylus profilometer as above. The Young's modulus of the second gate insulating coating was also measured using the same microhardness tester as above. The Young's modulus of the second gate insulating coating 22 was 300 GPa.

The silicon nitride film was formed using a plasma CVD device under the following conditions.

Silicon Nitride Film Forming Conditions

Reactive gas: Silane/ammonia/hydrogen/nitrogen
Reactive gas flow rate: 10 sccm (silane), 70 sccm (ammonia)
5000 sccm (hydrogen), 2000 sccm (nitrogen)
Film formation pressure: 200 Pa
Radio wave power: 1000 W
Radio wave power frequency: 13.56 MHz
Substrate temperature: 200° C.
Film formation time: 90 sec Subsequently, using a DC magnetron sputtering system, an InGaZnO film having a thickness of 50 nm was formed. Next, a resist pattern was formed on the InGaZnO film using photolithography. Then, the resist pattern was removed by wet-etching the InGaZnO film to obtain the semiconductor layer 13. The thickness of the semiconductor layer 13 was measured using the same stylus profilometer as above. The Young's modulus of the semiconductor layer 13 was also measured using the same microhardness tester as above. The Young's modulus of the semiconductor layer 13 was 150 GPa.

The InGaZnO film was formed using sputtering under the following conditions.

InGaZnO Film Forming Conditions

Target composition ratio: at % In:Ga:Zn:O=1:1:1:4

Sputtering gas: Argon/oxygen

Sputtering gas flow rate: 50 sccm (argon), 0.2 sccm (oxygen)

Film formation pressure: 1.0 Pa

Target power: 450 W (DC)

Target frequency: 13.56 MHz

Substrate temperature: Room temperature

Film formation time: 25 min

Subsequently, a photosensitive acrylic polymer film having a thickness of 40 nm was formed as the protective layer 31. First, a photosensitive acrylic polymer solution containing a photosensitive acrylic polymer, which is an organic polymer compound, was diluted four folds with propylene glycol monomethyl ether acetate to prepare the coating solution. Then, a coating film was formed by applying the coating solution to the upper surfaces of the semiconductor layer 13 and the second gate insulating coating 22 using spin coating. The coating film was patterned using photolithography, and the coating film was baked to obtain a protective layer 31 of a photosensitive acrylic polymer. The thickness of the protective layer 31 was measured using the same stylus profilometer as above. The Young's modulus of the second gate insulating coating was also measured using the same microhardness tester as above. The Young's modulus of the protective layer 31 was 3 GPa.

The photosensitive acrylic polymer film was formed using spin coating under the following conditions.

Photosensitive Acrylic Polymer Film Forming Conditions

Substrate rotation speed: 1580 rpm/30 sec

Sintering temperature: 190° C.

Sintering time: 1 hour

Subsequently, using a DC magnetron sputtering system, an AlNd film having a thickness of 80 nm was formed over the protective layer 31 and the semiconductor layer 13 at room temperature. Next, a resist pattern was formed on the AlNd film using photolithography. Then, the resist pattern was removed from the AlNd film by wet-etching the AlNd film to obtain the source electrode layer 14 and the drain electrode layer 15. The AlNd film forming conditions were as follows.

AlNd Film Forming Conditions

Target composition ratio: Al (at %):Nd (at %)=98:2

Sputtering gas: Argon

Sputtering gas flow rate: 100 sccm

Film formation pressure: 1.0 Pa

Target power: 200 W (DC)

Substrate temperature: Room temperature

The thin film transistor of Example 2-1 was thus obtained. The thin film transistor had a channel length of 10 μm and a channel width of 30 μm.

Example 2-2

The thin film transistor of Example 2-2 was obtained in the same manner as in Example 2-1 except that the photosensitive acrylic polymer solution was diluted three folds, and the rotational speed of the substrate and the sintering conditions for forming the photosensitive acrylic polymer film were changed as follows. The protective layer 31 had a thickness of 50 nm and Young's modulus of 5 GPa.

Photosensitive Acrylic Polymer Film Forming Conditions

Substrate rotation speed: 3400 rpm/30 sec

Sintering condition: 200° C.

Example 2-3

The thin film transistor of Example 2-3 was obtained in the same manner as in Example 2-1 except that the photosensitive acrylic polymer solution was diluted three folds, and the rotational speed of the substrate and the sintering conditions for forming the photosensitive acrylic polymer film were changed as follows. The protective layer 31 had a thickness of 100 nm and Young's modulus of 10 GPa.

Photosensitive Acrylic Polymer Film Forming Conditions

Substrate rotation speed: 1080 rpm/30 sec

Sintering condition: 200° C.

Example 2-4

The thin film transistor of Example 2-4 was obtained in the same manner as in Example 2-1 except that the photosensitive acrylic polymer solution was diluted two folds, and the rotational speed of the substrate and the sintering conditions for forming the photosensitive acrylic polymer film were changed as follows. The protective layer 31 had a thickness of 300 nm and Young's modulus of 10 GPa.

Photosensitive Acrylic Polymer Film Forming Conditions

Substrate rotation speed: 2640 rpm/30 sec

Sintering condition: 200° C.

Example 2-5

The thin film transistor of Example 2-5 was obtained in the same manner as in Example 2-1 except that the photosensitive acrylic polymer solution was diluted two folds, and the rotational speed of the substrate and the sintering conditions for forming the photosensitive acrylic polymer film were changed as follows. The protective layer 31 had a thickness of 500 nm and Young's modulus of 15 GPa.

Photosensitive Acrylic Polymer Film Forming Conditions

Substrate rotation speed: 1120 rpm/30 sec

Sintering condition: 210° C.

Example 2-6

The thin film transistor of Example 2-6 was obtained in the same manner as in Example 2-1 except that the photosensitive acrylic polymer solution was diluted two folds, and the rotational speed of the substrate and the sintering conditions for forming the photosensitive acrylic polymer film were changed as follows. The protective layer 31 had a thickness of 800 nm and Young's modulus of 15 GPa.

Photosensitive Acrylic Polymer Film Forming Conditions

Substrate rotation speed: 510 rpm/30 sec

Sintering condition: 210° C.

Example 2-7

The thin film transistor of Example 2-7 was obtained in the same manner as in Example 2-1 except that the photosensitive acrylic polymer solution was not diluted, and the rotational speed of the substrate and the sintering conditions for forming the photosensitive acrylic polymer film were changed as follows. The protective layer 31 had a thickness of 1000 nm and Young's modulus of 15 GPa.

Photosensitive Acrylic Polymer Film Forming Conditions

Substrate rotation speed: 1090 rpm/30 sec

Sintering condition: 210° C.

Example 2-8

The thin film transistor of Example 2-8 was obtained in the same manner as in Example 2-1 except that the photosensitive acrylic polymer solution was not diluted, and the rotational speed of the substrate and the sintering conditions for forming the photosensitive acrylic polymer film were changed as follows. The protective layer 31 had a thickness of 1000 nm and Young's modulus of 20 GPa.

Photosensitive Acrylic Polymer Film Forming Conditions

Substrate rotation speed: 1070 rpm/30 sec

Sintering condition: 220° C.

Example 2-9

The thin film transistor of Example 2-9 was obtained in the same manner as in Example 1-1 except that the protective layer 31 was changed to a photosensitive cycloolefin polymer film with a thickness of 1000 nm.

To form the photosensitive cycloolefin polymer film, a coating film was formed by applying a photosensitive cycloolefin polymer solution containing a photosensitive cycloolefin polymer, which is an organic polymer compound, to the upper surfaces of the semiconductor layer 13 and the second gate insulating coating 22 by spin coating. The coating film was patterned using photolithography, and the coating film was baked to obtain a protective layer 31 of a photosensitive cycloolefin polymer. The thickness of the protective layer 31 was measured using the same stylus profilometer as above. The Young's modulus of the protective layer 31 was also measured using the same microhardness tester as above. The Young's modulus of the protective layer 31 was 20 GPa.

The photosensitive cycloolefin polymer film was formed using spin coating under the following conditions.

Photosensitive Cycloolefin Polymer Film Forming Conditions

Substrate rotation speed: 1200 rpm/30 sec

Sintering temperature: 230° C.

Sintering time: 1 hour

Example 2-10

The thin film transistor of Example 2-10 was obtained in the same manner as in Example 2-8 except that the structure of the thin film transistor was changed to the structure showed in FIG. 6.

Example 2-11

The thin film transistor of Example 2-11 was obtained in the same manner as in Example 1-1 except that the first gate insulating coating 21 and the protective layer 31 were formed using a photosensitive polymethylsilsesquioxane having a thickness of 500 nm.

In the formation of the first gate insulating coating 21, a coating film was formed by applying a precursor solution of a photosensitive polymethylsilsesquioxane, which is an organic-inorganic composite material, to the upper surfaces of the flexible substrate 11 and the gate electrode layer 12 using spin coating. The coating film was exposed and developed by photolithography, and then baked to obtain the first gate insulating coating 21 made of a photosensitive polymethylsilsesquioxane film. The thickness of the first gate insulating coating 21 was measured using the same stylus profilometer as above. The Young's modulus of the first gate insulating coating was also measured using the same microhardness tester as above. The Young's modulus of the first gate insulating coating 21 was 20 GPa.

In the formation of the protective layer 31, a coating film was formed by applying a precursor solution of photosensitive polymethylsilsesquioxane, which is an organic-inorganic composite material, to the upper surfaces of the semiconductor layer 13 and the second gate electrode layer 22 using spin coating. The coating film was patterned using photolithography, and then baked to obtain a protective layer 31 of photosensitive polymethylsilsesquioxane. The thickness of the protective layer 31 was measured using the same stylus profilometer as above. The Young's modulus of the protective layer 31 was also measured using the same microhardness tester as above. The Young's modulus of the protective layer 31 was 20 GPa.

The photosensitive polymethylsilsesquioxane film was formed using spin coating under the following conditions.

Photosensitive Polymethylsilsesquioxane Forming Conditions

Substrate rotation speed: 1000 rpm/30 sec

Sintering temperature: 200° C.

Sintering time: 1 hour

Example 2-12

The thin film transistor of Example 2-12 was obtained in the same manner as in Example 2-1 except that the first gate insulating coating 21 and the protective layer 31 were changed to a film of an organic-inorganic composite material having a thickness of 500 nm. A material in which nanoparticles of silicon oxide are dispersed in an acrylic polymer was used as the organic-inorganic composite material.

In the formation of the first gate insulating coating 21, a coating film was formed by applying a solution in which silicon oxide nanoparticles are dispersed in a solution containing an acrylic polymer to the upper surfaces of the flexible substrate 11 and the gate electrode layer 12 using gravure offset printing. Then, the coating film was baked to obtain the first gate insulating coating 21 of an organic-inorganic composite material. The thickness of the first gate insulating coating 21 was measured using the same stylus profilometer as above. The Young's modulus of the first gate insulating coating was also measured using the same microhardness tester as above. The Young's modulus of the first gate insulating coating 21 was 20 GPa.

In the formation of the protective layer 31, a coating film having the pattern of the protective layer 31 was formed by applying a solution in which silicon oxide nanoparticles are dispersed in a solution containing an acrylic polymer to the upper surfaces of the semiconductor layer 13 and the second gate electrode layer 22 using gravure offset printing. Then, the coating film was baked to obtain the protective layer 31 of an acrylic polymer in which silicon oxide nanoparticles are dispersed. The thickness of the protective layer 31 was measured using the same stylus profilometer as above. The Young's modulus of the protective layer 31 was also measured using the same microhardness tester as above. The Young's modulus of the protective layer 31 was GPa.

The sintering conditions of the acrylic polymer film in which silicon oxide nanoparticles are dispersed are as follows.

Acrylic Polymer Film Sintering Conditions

Sintering temperature: 250° C.

Sintering time: 1 hour

Example 2-13

The thin film transistor of Example 2-13 was obtained in the same manner as in Example 2-1 except that the rotation speed of the substrate when forming the photosensitive acrylic polymer film was changed as follows. The protective layer 31 had a thickness of 30 nm and Young's modulus of 3 GPa.

Photosensitive Acrylic Polymer Film Forming Conditions

Substrate rotation speed: 2530 rpm/30 sec

Example 2-14

The thin film transistor of Example 2-14 was obtained in the same manner as in Example 2-1 except that the photosensitive acrylic polymer solution forming the protective layer 31 was not diluted, and the rotational speed of the substrate and the sintering conditions for forming the photosensitive acrylic polymer film were changed as follows. The protective layer 31 had a thickness of 1200 nm and Young's modulus of 20 GPa.

Photosensitive Acrylic Polymer Film Forming Conditions

Substrate rotation speed: 800 rpm/30 sec

Sintering temperature: 220° C.

Example 2-15

The thin film transistor of Example 2-15 was obtained in the same manner as in Example 2-1 except that the rotation speed of the substrate and the sintering conditions in the formation of the photosensitive acrylic polymer film were changed as follows. The protective layer 31 had a thickness of 40 nm and Young's modulus of 2 GPa.

Photosensitive Acrylic Polymer Film Forming Conditions

Substrate rotation speed: 1600 rpm/30 sec

Sintering temperature: 180° C.

Example 2-16

The thin film transistor of Example 2-16 was obtained in the same manner as in Example 2-1 except that the photosensitive acrylic polymer solution forming the protective layer 31 was not diluted, and the rotational speed of the substrate and the sintering conditions for forming the photosensitive acrylic polymer film were changed as follows. The protective layer 31 had a thickness of 1000 nm and Young's modulus of 30 GPa.

Photosensitive Acrylic Polymer Film Forming Conditions

Substrate rotation speed: 1170 rpm/30 sec

Sintering temperature: 230° C.

Example 2-17

The thin film transistor of Example 2-17 was obtained in the same manner as in Example 2-1 except that the protective layer 31 was changed to a silicon oxide film with a thickness of 40 nm.

To form the protective layer 31, a silicon oxide film having a thickness of 40 nm was formed on the upper surfaces of the second gate insulating coating 22 and the semiconductor layer 13 using a plasma CVD device. Then, a resist pattern was formed on the silicon oxide film using photolithography. The protective layer 31 was obtained by dry-etching the silicon oxide film and removing the resist pattern from the silicon oxide film. The Young's modulus of the protective layer 31 was 50 GPa. The silicon oxide film forming conditions were as follows.

Conditions for Silicon Oxide Film Formation

Reactive gas: Silane/nitrous oxide

Reactive gas flow rate: 65 sccm (silane)

500 sccm (dinitrogen monoxide)

Film formation pressure: 200 Pa

Radio wave power: 500 W

Radio wave power frequency: 13.56 MHz

Substrate temperature: 200° C.

Film formation time: 160 sec

Example 2-18

The thin film transistor of Example 2-18 was obtained in the same manner as in Example 2-1 except that the protective layer 31 was changed to a silicon nitride film with a thickness of 40 nm.

To form the protective layer 31, a silicon nitride film having a thickness of 40 nm was formed on the upper surfaces of the semiconductor layer 13 and the second gate insulating coating 22 using a plasma CVD device. Then, a resist pattern was formed on the silicon nitride film using photolithography. The protective layer 31 was obtained by dry-etching the silicon nitride film and removing the resist pattern therefrom. The Young's modulus of the protective layer 31 was 150 GPa. The silicon nitride film forming conditions were as follows.

Silicon Nitride Film Forming Conditions

Reactive gas: Silane/ammonia/hydrogen/nitrogen

Reactive gas flow rate: 10 sccm (silane), 70 sccm (ammonia)

5000 sccm (hydrogen), 2000 sccm (nitrogen)

Film formation pressure: 200 Pa

Radio wave power: 1000 W

Radio wave power frequency: 13.56 MHz

Substrate temperature: 200° C.

Film formation time: 120 sec

Example 2-19

The thin film transistor of Example 2-19 was obtained in the same manner as in Example 2-1 except that the protective layer 31 was formed with a silicon nitride film having a thickness of 60 nm.

To form the protective layer 31, first, a silicon nitride film having a thickness of 60 nm was formed on the upper surfaces of the semiconductor layer 13 and the second gate insulating coating 22 using a plasma CVD device. Then, a resist pattern was formed on the silicon nitride film using photolithography. The silicon nitride film was dry-etched and the resist pattern was removed therefrom. The protective layer 31 was thus obtained. The silicon nitride film forming conditions were as follows. The Young's modulus of the protective layer 31 was 150 GPa.

Silicon Nitride Film Forming Conditions

Reactive gas: Silane/ammonia/hydrogen/nitrogen

Reactive gas flow rate: 10 sccm (silane), 70 sccm (ammonia)

5000 sccm (hydrogen), 2000 sccm (nitrogen)

Film formation pressure: 200 Pa

Radio wave power: 1000 W

Radio wave power frequency: 13.56 MHz
Substrate temperature: 200° C.
Film formation time: 180 sec Comparative Example 2-1

The thin film transistor of Comparative Example 2-1 was obtained in the same manner as in Example 2-1 except that the protective layer 31 was formed with a silicon oxide film having a thickness of 150 nm.

To form the protective layer 31, first, a silicon oxide film having a thickness of 150 nm was formed on the upper surfaces of the second gate insulating coating 22 and the semiconductor layer 13 using a plasma CVD device. Then, a resist pattern was formed on the silicon oxide film using photolithography. The silicon oxide film was patterned by dry-etching, and the resist pattern was removed therefrom. The protective layer 31 was thus obtained. The silicon oxide film forming conditions were as follows. The Young's modulus of the protective layer 31 was 70 GPa.

Conditions for Silicon Oxide Film Formation
Reactive gas: Silane/nitrous oxide
Reactive gas flow rate: 80 sccm (silane)
800 sccm (dinitrogen monoxide)
Film formation pressure: 200 Pa
Radio wave power: 600 W
Radio wave power frequency: 13.56 MHz
Substrate temperature: 200° C.
Film formation time: 260 sec Comparative Example 2-2

The thin film transistor of Comparative Example 2-2 was obtained in the same manner as in Example 2-1 except that the protective layer 31 was formed with a silicon nitride film having a thickness of 80 nm.

To form the protective layer 31, first, a silicon nitride film having a thickness of 80 nm was formed on the upper surfaces of the semiconductor layer 13 and the second gate insulating coating 22 using a plasma CVD device. Then, a resist pattern was formed on the silicon nitride film using photolithography. The silicon nitride film was dry-etched and the resist pattern was removed therefrom. The protective layer 31 was thus obtained. The silicon nitride film forming conditions were as follows. The Young's modulus of the protective layer 31 was 150 GPa.

Silicon Nitride Film Forming Conditions
Reactive gas: Silane/ammonia/hydrogen/nitrogen
Reactive gas flow rate: 10 sccm (silane), 70 sccm (ammonia)
5000 sccm (hydrogen), 2000 sccm (nitrogen)
Film formation pressure: 200 Pa
Radio wave power: 1000 W
Radio wave power frequency: 13.56 MHz
Substrate temperature: 200° C.
Film formation time: 240 sec Evaluation Method The transfer characteristics of the thin film transistors of Examples 2-1 to 2-19 and Comparative Examples 2-1 and 2-2 were measured using a semiconductor parameter analyzer (B1500A, manufactured by Agilent Technologies). Then, the mobility and on/off ratio were calculated. The mobility decrease rate and the on/off ratio difference were calculated in the same manner as in the Examples of the first embodiment.

Evaluation Results

With reference to FIGS. 7 to 11, the evaluation results will be described below. FIG. 7 shows the thickness T1 (nm) and Young's modulus E1 (GPa) of the first gate insulating coating 21, and the product T1E1 (nm·GPa) of the thickness T1 and Young's modulus E1 for each of the thin film transistors of Examples 2-1 to 2-19. FIG. 7 also shows the thickness T2 (nm) and Young's modulus E2 (GPa) of the second gate insulating coating 22, and the product T2E2 (nm·GPa) of the thickness T2 and Young's modulus E2 for each of the thin film transistors of Examples 2-1 to 2-19. FIG. 7 further shows the thickness T4 (nm) and Young's modulus E4 of the protective layer 31, and the product T4E4 (nm·GPa) of the thickness T4 and Young's modulus E4 for each of the thin film transistors of Examples 2-1 to 2-19.

FIG. 8 shows the mobility, the mobility decrease rate, the on/off ratio before the bending test, and the on/off ratio difference for each of the thin film transistors of Examples 2-1 to 2-19.

On the other hand, FIG. 9 shows the thickness T1 (nm) and Young's modulus E1 (GPa) of the first gate insulating coating 21, and the product T1E1 (nm·GPa) of the thickness T1 and Young's modulus E1 for each of the thin film transistors of Comparative Examples 2-1 and 2-2. FIG. 9 also shows the thickness T2 (nm) and Young's modulus E2 (GPa) of the second gate insulating coating 22, and the product T2E2 (nm·GPa) of the thickness T2 and Young's modulus E2 for each of the thin film transistors of Comparative Examples 2-1 and 2-2.

FIG. 10 shows the thickness T3 (nm) and Young's modulus E3 (GPa) of the semiconductor layer 13, and the product (T3E3) of the thickness T3 and Young's modulus E3 for each of the thin film transistors of Comparative Examples 2-1 and 2-2. FIG. 10 also shows the thickness T4 (nm) and Young's modulus E4 (GPa) of the protective layer 31, and the product (T4E4) of the thickness T4 and Young's modulus E4 for each of the thin film transistors of Comparative Examples 2-1 and 2-2.

FIG. 11 shows the mobility, the mobility decrease rate, the on/off ratio before the bending test, and the on/off ratio difference for each of the thin film transistors of Comparative Examples 2-1 and 2-2.

FIGS. 7 to 11 show that the mobility before the bending test was within the range of 10.2 or greater and 10.9 or less, and the rate of decrease in mobility after the bending test was within the range of 0.0% or higher and 1.9% or lower for the thin film transistors of Examples 2-1 to 2-19. On the other hand, for the thin film transistors of Comparative Examples 2-1 and 2-2, the mobility before the bending test was within the range of 10.3 or greater and 10.5 or less. This means that their mobilities were similar to those of the thin film transistors of Examples. In contrast, the rate of decrease in mobility after the bending test was 69.6% or higher for the thin film transistors of Comparative Examples 2-1 and 2-2, which is significantly higher than the rate of decrease in mobility of the Examples.

That is, it was found that, when the thin film transistor satisfies Condition 1 described above, the decrease in mobility after the bending test can be suppressed by forming the protective layer 31 with an organic polymer compound or an organic-inorganic composite material. Further, when the thin film transistor satisfies Condition 1, and the protective layer 31 is made of silicon oxide or silicon nitride, the rate of decrease in mobility can be reduced by forming the protective layer 31 so that it satisfies Condition 5 described above.

On the other hand, with regard to the thin film transistor of Comparative Example 2-1, it is considered that the high thickness of the protective layer 31 made the protective layer 31 prone to cracking when the thin film transistor is bent, which deteriorates the semiconductor layer 13 and increases the rate of decrease in mobility. With regard to the thin film transistor of Comparative Example 2-2, it is considered that the high Young's modulus of the protective layer 31 made the protective layer 31 prone to cracking when the thin film transistor is bent, which deteriorates the semiconductor layer 13 and increases the rate of decrease in mobility.

The number of digits of the on/off ratio before the bending test was nine for the thin film transistors of Examples 2-1 to 1-16. The number of digits of the on/off ratio difference after the bending test was one or less for the thin film transistors of Examples 2-1 to 1-16. On the other hand, for the Examples 2-17 to 2-19 and Comparative Examples 2-1 and 2-2, the number of digits of the on/off ratio before the bending test was nine, and the number of digits of the on/off ratio difference was six or seven.

That is, when the protective layer 31 is made of an organic polymer compound or an organic-inorganic composite material, the on/off ratio difference before and after the bending test is significantly less than when the protective layer 31 is made of an inorganic compound.

These results indicate that, when the protective layer 31 is made of an inorganic compound, the cracking of the protective layer 31, deterioration of the film quality, and destabilization of the interface between the semiconductor layer 13 and the protective layer 31 caused when the thin film transistor is bent are intensified. The cracking of the protective layer 31, deterioration of the film quality, and destabilization of the interface between the semiconductor layer 13 and the protective layer 31 cause leak current to flow through the protective layer 31 between the source electrode layer 14 and the drain electrode layer 15. This increases the off current after bending. As a result, the on/off ratio decreases, and the on/off ratio difference increases.

On the other hand, it can be considered that, when the protective layer 31 is made of an organic polymer compound or an organic-inorganic composite material, cracking of the protective layer 31, deterioration of the film quality, and destabilization of the interface between the semiconductor layer 13 and the protective layer 31 due to bending of the thin film transistor are less likely to occur, and therefore the on/off ratio difference of the thin film transistor is reduced.

FIG. 8 shows that the number of digits of the on/off ratio difference was zero for the thin film transistor of Examples 2-1 and 2-12, whereas the number of digits of the on/off ratio difference was one for the thin film transistors of Examples 2-13 to 2-16. That is, when the thickness of the protective layer 31 is within the range of 40 nm or greater and 1000 nm or less, and the product of the thickness and Young's modulus is within the range of 120 nm·GPa or greater and 20000 nm·GPa or less, the on/off ratio can be further reduced.

With regard to the thin film transistor of Example 2-16, it can be considered that the high Young's modulus of the protective layer 31 makes the protective layer 31 less deformable. This destabilizes the interface between the protective layer 31 and the semiconductor layer 13 when the thin film transistor is bent and increases the on/off ratio difference. With regard to the thin film transistor of Example 2-14, the large thickness of the protective layer 31 causes the strain energy generated in the protective layer 31 when the thin film transistor is bent to increase. This destabilizes the interface between the semiconductor layer 13 and the protective layer 31 when the thin film transistor is bent, leading to a large on/off ratio difference.

With regard to the thin film transistor of Example 2-15, it can be considered that the Young's modulus was so small that the film quality of the protective layer 31 was likely to deteriorate, and the state of the interface between the semiconductor layer 13 and the protective layer 31 became unstable. Therefore, the thin film transistor of Example 2-15 tends to have a large on/off ratio difference when the thin film transistor is bent. With regard to the thin film transistor of Example 2-13, it can be considered that, since the film thickness of the protective layer 31 is not large enough to avoid deterioration of the semiconductor layer 13 in the steps after the formation of the protective layer 31 is formed, the surface of the semiconductor layer 13 is damaged, and the state of the interface between the semiconductor layer 13 and the protective layer 31 becomes unstable. Therefore, the thin film transistor of Example 2-13 tends to have a large on/off ratio difference when the thin film transistor is bent.

In contrast to these thin film transistors of Examples 2-13 to 2-16, according to the thin film transistors of Examples 2-1 to 1-12, it can be considered that on/off ratio before and after the bending test was reduced since the cracking, deterioration of the film quality, and destabilization of the interface between the semiconductor layer 13 and the protective layer 31 were suppressed in the protective layer 31.

As is clear from the evaluation results of the thin film transistors of Examples 2-1 to 2-16, similar effects were obtained regardless of whether the materials forming the first gate insulating coating 21 and the protective layer 31 are an organic polymer compound or an organic-inorganic composite material. The results also showed that the organic-inorganic composite material may be a mixture of particles of an organic polymer processed product and particles of an inorganic compound, or a substance including an atomic group having the property of an inorganic compound and an atomic group having the property of an organic compound in its molecular structure.

As described above, according to the second embodiment of a thin film transistor, the following effects can be obtained in addition to the effects described in 1-1 and 1-2.

2-1: Since the thin film transistor includes the protective layer 31 covering the semiconductor layer 13, the protective layer 31 protects the semiconductor layer 13 in the steps after forming the protective layer 31. The protective layer 31 also protects the semiconductor layer 13 from the atmosphere in which the thin film transistor is placed after the thin film transistor is manufactured.

2-2: With a structure that satisfies Condition 4 described above, deterioration of the film quality and deterioration of bendability of the protective layer 31 are suppressed. This prevents the interface between the semiconductor layer 13 and the protective layer 31 from becoming unstable. As a result, the formation of a leak path between the source electrode layer 14 and the drain electrode layer 15 can be prevented. Since the leakage current between the source electrode layer 14 and the drain electrode layer 15 caused when the thin film transistor is bent is suppressed, the off current of the thin film transistor can be kept low even when the thin film transistor is bent. This makes it possible to reduce the difference between the on/off ratio of the thin film transistor before being bent and the on/off ratio of the thin film transistor after being bent. As a result, it is possible to further improve the electrical durability of the thin film transistor against bending of the flexible substrate 11.

2-3: With a structure that satisfies Condition 5 described above, deterioration of the film quality and deterioration of bendability of the protective layer 31 are suppressed. This prevents the interface between the semiconductor layer 13 and the protective layer 31 from becoming unstable. As a result, the formation of a leak path between the source electrode layer 14 and the drain electrode layer 15 can be prevented. Since the leakage current between the source electrode layer 14 and the drain electrode layer 15 caused when the thin film transistor is bent is suppressed, the off current of the thin film transistor can be kept low even when the thin film transistor is bent. This makes it possible to reduce the difference between the on/off ratio of the thin film transistor before being bent and the on/off ratio of the thin film transistor after being bent. As a result, it is possible to further improve the electrical durability of the thin film transistor against bending of the flexible substrate 11.

A thin film transistor having a gate insulating layer including an organic polymer compound film and an inorganic silicon compound film combines a good withstand voltage and flexibility. When the aim of improving the electrical characteristics of the thin film transistor and improving the adhesion between the layers in the thin film transistor, it has been proposed to control the dielectric property value of the gate insulating layer ($=(\varepsilon_A/d_A)/(\varepsilon_B/d_B)$) to 0.015 or higher and 1.0 or lower (for example, see JP 2010-21264 A). The relative permittivity EA used to calculate the dielectric property value is the relative permittivity of the first gate insulating coating containing the organic polymer compound. The thickness $d_A$ is the thickness of the first gate insulating coating. The relative permittivity EB used to calculate the dielectric property value is the relative permittivity of the second gate insulating coating containing the inorganic polymer compound. The thickness $d_B$ is the thickness of the second gate insulating coating.

The relative permittivity of the gate insulating layer is an index value indicating whether a certain amount of charge induced per unit area can be secured. It is also an index value indicating whether current leakage between the gate electrode and another electrode can be suppressed. Meanwhile, the relative permittivity of the gate insulating layer is not closely related to the electrical durability against bending of the flexible substrate. Similarly, the above-described dielectric property value, which compares the susceptibility to dielectric polarization of the first gate insulating coating to that of the second gate insulating coating, is also not closely related to the electrical durability against bending of the flexible substrate. As a result, when the configuration has a relative permittivity within a predetermined range, or even when the configuration has a dielectric property value within the predetermined range, it may not be possible to increase the electrical durability against bending of the flexible substrate.

A thin film transistor according to an embodiment of the present invention includes a flexible substrate having a support surface; a gate electrode layer located in a first part of the support surface; a gate insulating layer covering a second part of the support surface and the gate electrode layer; a semiconductor layer sandwiching the gate insulating layer with the gate electrode layer; a source electrode layer in contact with a first end of the semiconductor layer with no insulating layer between the source electrode layer and the semiconductor layer; and a drain electrode layer in contact with a second end of the semiconductor layer with no insulating layer between the drain electrode layer and the semiconductor layer. The gate insulating layer includes a first gate insulating coating made of an organic polymer compound or an organic-inorganic composite material and covering the second part and the gate electrode layer, and a second gate insulating coating made of one selected from silicon oxide, silicon nitride, silicon oxynitride, and aluminum oxide. The second gate insulating coating is sandwiched between the first gate insulating coating and a semiconductor layer. The first gate insulating coating has a thickness of 100 nm or greater and 1500 nm or less, and a product of the thickness and Young's modulus of the first gate insulating coating is 300 nm·GPa or greater and 30000 nm·GPa or less. The second gate insulating coating has a thickness of 2 nm or greater and 30 nm or less, and a product of the thickness and Young's modulus of the second gate insulating coating is 100 nm·GPa or greater and 9000 nm·GPa or less.

A method of manufacturing a thin film transistor according to an embodiment of the present invention includes forming a gate electrode layer on a first part of a support surface of a flexible substrate; forming a gate insulating layer covering a second part of the support surface and the gate electrode layer; forming a semiconductor layer sandwiching the gate insulating layer with the gate electrode layer; and forming a source electrode layer in contact with a first end of the semiconductor layer with no insulating layer between the source electrode layer and the semiconductor layer, and a drain electrode layer in contact with a second end of the semiconductor layer with no insulating layer between the drain electrode layer and the semiconductor layer. Forming the gate insulating layer includes forming, by a coating method, a first gate insulating coating made of an organic polymer compound or an organic-inorganic composite material and covering the second part and the gate electrode layer, and forming a second gate insulating coating made of one selected from silicon oxide, silicon nitride, silicon oxynitride, and aluminum oxide, and sandwiched between the first gate insulating coating and the semiconductor layer. The first gate insulating coating has a thickness of 100 nm or greater and 1500 nm or less, and a product of the thickness and Young's modulus of the first gate insulating coating is 300 nm·GPa or greater and 30000 nm·GPa or less. The second gate insulating coating has a thickness of 2 nm or greater and 30 nm or less, and a product of the thickness and Young's modulus of the second gate insulating coating is 100 nm·GPa or greater and 9000 nm·GPa or less.

A thin film transistor according to an embodiment of the present invention includes a flexible substrate having a support surface; a gate electrode layer located in a first part of the support surface; a gate insulating layer covering a second part of the support surface and the gate electrode layer; a semiconductor layer sandwiching the gate insulating layer with the gate electrode layer; a protective layer covering the semiconductor layer so that first and second regions on an upper surface of the semiconductor layer are exposed through the protective layer; a source electrode layer in contact with the first region; and a drain electrode layer in contact with the second region. The protective layer is made of an organic polymer compound or an organic-inorganic composite material. The gate insulating layer includes a first gate insulating coating made of an organic polymer compound or an organic-inorganic composite material and covering the second part and the gate electrode layer, and a second gate insulating coating made of one selected from silicon oxide, silicon nitride, silicon oxynitride, and aluminum oxide. The second gate insulating coating is sandwiched between the first gate insulating coating and a semiconductor layer. The first gate insulating coating has a thickness of 100 nm or greater and 1500 nm or less, and a product of the thickness and Young's modulus of the first gate insulating coating is 300 nm·GPa or greater and 30000 nm·GPa or less. The second gate insulating coating has a thickness of 2 nm or greater and 30 nm or less, and a product of the thickness and Young's modulus of the second gate insulating coating is 100 nm·GPa or greater and 9000 nm·GPa or less.

A method of manufacturing a thin film transistor according to an embodiment of the present invention includes: forming a gate electrode layer on a first part of a support surface of a flexible substrate; forming a gate insulating layer covering a second part of the support surface and the gate electrode layer; forming a semiconductor layer sandwiching the gate insulating layer with the gate electrode layer; forming a protective layer so that first and second regions on an upper surface of the semiconductor layer are exposed through the protective layer, the protective layer being made of an organic polymer compound or an organic-inorganic composite material; and forming a source electrode layer in contact with the first region, and a drain electrode layer in contact with the second region. Forming the gate insulating layer includes forming, by a coating method, a first gate insulating coating made of an organic polymer compound or an organic-inorganic composite material and covering the second part and the gate electrode layer, and forming a second gate insulating coating made of one selected from silicon oxide, silicon nitride, silicon oxynitride, and aluminum oxide, and sandwiched between the first gate insulating coating and the semiconductor layer. The first gate insulating coating has a thickness of 100 nm or greater and 1500 nm or less, a product of the thickness and Young's modulus of the first gate insulating coating is 300 nm·GPa or greater and 30000 nm·GPa or less, the second gate insulating coating has a thickness of 2 nm or greater and 30 nm or less, and a product of the thickness and Young's modulus of the second gate insulating coating is 100 nm·GPa or greater and 9000 nm·GPa or less.

A thin film transistor according to an embodiment of the present invention includes a flexible substrate having a support surface; a gate electrode layer located in a first part of the support surface; a gate insulating layer covering a second part of the support surface and the gate electrode layer; a semiconductor layer sandwiching the gate insulating layer with the gate electrode layer; a protective layer covering the semiconductor layer so that first and second regions on an upper surface of the semiconductor layer are exposed through the protective layer; a source electrode layer in contact with the first region; and a drain electrode layer in contact with the second region. The protective layer is made of silicon oxide, silicon nitride, or silicon oxynitride. The gate insulating layer includes a first gate insulating coating made of an organic polymer compound or an organic-inorganic composite material and covering the second part and the gate electrode layer, and a second gate insulating coating made of one selected from silicon oxide, silicon nitride, silicon oxynitride, and aluminum oxide. The second gate insulating coating is sandwiched between the first gate insulating coating and a semiconductor layer. The first gate insulating coating has a thickness of 100 nm or greater and 1500 nm or less, and a product of the thickness and Young's modulus of the first gate insulating coating is 300 nm·GPa or greater and 30000 nm·GPa or less. The second gate insulating coating has a thickness of 2 nm or greater and nm or less, and a product of the thickness and Young's modulus of the second gate insulating coating is 100 nm·GPa or greater and 9000 nm·GPa or less. The protective layer has a thickness of 40 nm or greater and 60 nm or less, and a product of the thickness and Young's modulus of the protective layer is 2000 nm·GPa or greater and 9000 nm·GPa or less.

Obviously, numerous modifications and variations of the present invention are possible in light of the above teachings. It is therefore to be understood that within the scope of the appended claims, the invention may be practiced otherwise than as specifically described herein.

The invention claimed is:

1. A thin film transistor, comprising:

a flexible substrate having a support surface;

a gate electrode layer formed in a first part of the support surface of the flexible substrate;

a gate insulating layer covering the gate electrode layer and a second part of the support surface of the flexible substrate;

a semiconductor layer formed such that the semiconductor layer and the gate electrode layer are sandwiching the gate insulating layer;

a source electrode layer formed in contact with a first end of the semiconductor layer such that no insulating layer is formed between the source electrode layer and the semiconductor layer; and a drain electrode layer formed in contact with a second end of the semiconductor layer such that no insulating layer is formed between the drain electrode layer and the semiconductor layer, wherein the gate insulating layer includes a first gate insulating coating and a second gate insulating coating such that the first gate insulating coating comprises an organic polymer compound or an organic-inorganic composite material and is covering the second part and the gate electrode layer and that the second gate insulating coating comprises one compound selected from the group consisting of silicon oxide, silicon nitride, silicon oxynitride, and aluminum oxide and is sandwiched between the first gate insulating coating and the semiconductor layer, the first gate insulating coating has a thickness in a range of 100 nm to 1500 nm and a product of the thickness and Young's modulus in a range of 300 nm·GPa to 30000 nm·GPa, and the second gate insulating coating has a thickness in a range of 2 nm to 30 nm and a product of the thickness and Young's modulus of the second gate insulating coating in a range of 100 nm·GPa to 9000 nm·GPa.

2. The thin film transistor according to claim 1, wherein the semiconductor layer has a thickness in a range of 15 nm to 50 nm.

3. The thin film transistor according to claim 1, wherein the semiconductor layer is an oxide semiconductor layer comprising indium.

4. A thin film transistor, comprising:

a flexible substrate having a support surface;

a gate electrode layer located in a first part of the support surface of the flexible substrate;

a gate insulating layer covering the gate electrode layer and a second part of the support surface of the flexible substrate;

a semiconductor layer formed such that the semiconductor layer and the gate electrode layer are sandwiching the gate insulating layer;

a protective layer formed such that the protective layer is covering the semiconductor layer and exposing first and second regions on an upper surface of the semiconductor layer;

a source electrode layer formed such that the source electrode layer is in contact with the first region on the upper surface of the semiconductor layer; and a drain electrode layer formed such that the drain electrode layer is in contact with the second region on the upper surface of the semiconductor layer, wherein the protective layer comprises an organic polymer compound or an organic-inorganic composite material, the gate insulating layer includes a first gate insulating coating and a second gate insulating coating such that the first gate insulating coating comprises an organic polymer compound or an organic-inorganic composite material and is covering the second part and the gate electrode layer and that the second gate insulating coating comprises one compound selected from the group consisting of silicon oxide, silicon nitride, silicon oxynitride, and aluminum oxide and is sandwiched between the first gate insulating coating and the semiconductor layer, the first gate insulating coating has a thickness in a range of 100 nm to 1500 nm and a product of the thickness and Young's modulus in a range of 300 nm·GPa to 30000 nm·GPa, and the second gate insulating coating has a thickness in a range of 2 nm to 30 nm and a product of the thickness and Young's modulus of the second gate insulating coating in a range of 100 nm·GPa to 9000 nm·GPa.

5. The thin film transistor according to claim 4, wherein the protective layer has a thickness in a range of 40 nm to 1000 nm and a product of the thickness and Young's modulus of the protective layer is in a range of 120 nm·GPa to 20000 nm·GPa.

6. The thin film transistor according to claim 4, wherein the semiconductor layer has a thickness in a range of 15 nm to 50 nm, and the protective layer has a product of the thickness and Young's modulus of the protective layer is 1500 nm·GPa or greater and 7500 nm·GPa or less.

7. The thin film transistor according to claim 4, wherein the semiconductor layer is an oxide semiconductor layer comprising indium.

8. The thin film transistor according to claim 5, wherein the semiconductor layer has a thickness in a range of 15 nm to 50 nm, and the protective layer has a product of the thickness and Young's modulus of the protective layer is 1500 nm·GPa or greater and 7500 nm·GPa or less.

9. The thin film transistor according to claim 5, wherein the semiconductor layer is an oxide semiconductor layer comprising indium.

10. A thin film transistor, comprising:

a flexible substrate having a support surface;

a gate electrode layer located in a first part of the support surface of the flexible substrate;

a gate insulating layer covering the gate electrode layer and a second part of the support surface of the flexible substrate;

a semiconductor layer formed such that the semiconductor layer and the gate electrode layer are sandwiching the gate insulating layer;

a protective layer formed such that the protective layer is covering the semiconductor layer and exposing first and second regions on an upper surface of the semiconductor layer;

a source electrode layer formed such that the source electrode layer is in contact with the first region on the upper surface of the semiconductor layer; and a drain electrode layer formed such that the drain electrode layer is in contact with the second region on the upper surface of the semiconductor layer, wherein the protective layer comprises silicon oxide, silicon nitride or silicon oxynitride, the gate insulating layer includes a first gate insulating coating and a second gate insulating coating such that the first gate insulating coating comprises an organic polymer compound or an organic-inorganic composite material and is covering the second part and the gate electrode layer and that the second gate insulating coating comprises one compound selected from the group consisting of silicon oxide, silicon nitride, silicon oxynitride, and aluminum oxide and is sandwiched between the first gate insulating coating and the semiconductor layer, the first gate insulating coating has a thickness in a range of 100 nm to 1500 nm and a product of the thickness and Young's modulus in a range of 300 nm·GPa to 30000 nm·GPa, and the second gate insulating coating has a thickness in a range of 2 nm to 30 nm and a product of the thickness and Young's modulus of the second gate insulating coating in a range of 100 nm·GPa to 9000 nm·GPa.

11. The thin film transistor according to claim 10, wherein the semiconductor layer has a thickness in a range of 15 nm to 50 nm, and the protective layer has a product of the thickness and Young's modulus of the protective layer is 1500 nm·GPa or greater and 7500 nm·GPa or less.

12. The thin film transistor according to claim 10, wherein the semiconductor layer is an oxide semiconductor layer comprising indium.

13. A method of manufacturing a thin film transistor, comprising:

forming a gate electrode layer on a first part of a support surface of a flexible substrate;

forming a gate insulating layer covering the gate electrode layer and a second part of the support surface of the flexible substrate;

forming a semiconductor layer such that the semiconductor layer and the gate electrode layer are sandwiching the gate insulating layer;

forming a source electrode layer such that the source electrode layer is in contact with a first end of the semiconductor layer and no insulating layer is formed between the source electrode layer and the semiconductor layer; and forming a drain electrode layer such that the drain electrode layer is in contact with a second end of the semiconductor layer and that no insulating layer is formed between the drain electrode layer and the semiconductor layer, wherein the forming of the gate insulating layer includes forming, by a coating method, a first gate insulating coating comprising an organic polymer compound or an organic-inorganic composite material such that the first gate insulating coating covers the second part and the gate electrode layer, and forming a second gate insulating coating comprising one compound selected from the group consisting of silicon oxide, silicon nitride, silicon oxynitride, and aluminum oxide such that the second gate insulating coating is sandwiched between the first gate insulating coating and the semiconductor layer, the first gate insulating coating is formed such that the first gate insulating coating has a thickness in a range of 100 nm to 1500 nm and a product of the thickness and Young's modulus of the first gate insulating coating is in a range of 300 nm·GPa to 30000 nm·GPa, and the second gate insulating coating is formed such that the second gate insulating coating has a thickness in a range of 2 nm to 30 nm and a product of the thickness and Young's modulus of the second gate insulating coating is in a range of 100 nm·GPa to 9000 nm·GPa.

14. A method of manufacturing a thin film transistor, comprising:

forming a gate electrode layer on a first part of a support surface of a flexible substrate;

forming a gate insulating layer covering the gate electrode layer and a second part of the support surface of the flexible substrate;

forming a semiconductor layer such that the semiconductor layer and the gate electrode layer are sandwiching the gate insulating layer;

forming a protective layer comprising an organic polymer compound or an organic-inorganic composite material such that the protective layer exposes first and second regions on an upper surface of the semiconductor layer; and forming a source electrode layer such that the source electrode layer is in contact with the first region on the upper surface of the semiconductor layer; and forming a drain electrode layer such that the drain electrode layer is in contact with the second region on the upper surface of the semiconductor layer, wherein the forming of the gate insulating layer includes forming, by a coating method, a first gate insulating coating comprising an organic polymer compound or an organic-inorganic composite material such that the first gate insulating coating covers the second part and the gate electrode layer, and forming a second gate insulating coating comprising one compound selected from the group consisting of silicon oxide, silicon nitride, silicon oxynitride, and aluminum oxide such that the second gate insulating coating is sandwiched between the first gate insulating coating and the semiconductor layer, the first gate insulating coating is formed such that the first gate insulating coating has a thickness in a range of 100 nm to 1500 nm and a product of the thickness and Young's modulus of the first gate insulating coating is in a range of 300 nm·GPa to 30000 nm·GPa, and the second gate insulating coating is formed such that the second gate insulating coating has a thickness in a range of 2 nm to 30 nm and a product of the thickness and Young's modulus of the second gate insulating coating is in a range of 100 nm·GPa to 9000 nm·GPa.

* * * * *